United States Patent
Shimizu et al.

(10) Patent No.: US 8,881,353 B2
(45) Date of Patent: Nov. 11, 2014

(54) METHOD OF PRODUCING PIEZOELECTRIC/ELECTROSTRICTIVE FILM TYPE DEVICE

(75) Inventors: Hideki Shimizu, Obu (JP); Mutsumi Kitagawa, Inuyama (JP)

(73) Assignee: NGK Insulators, Ltd., Nagoya (JP)

( * ) Notice: Subject to any disclaimer, the term of this patent is extended or adjusted under 35 U.S.C. 154(b) by 909 days.

(21) Appl. No.: 12/876,181

(22) Filed: Sep. 6, 2010

(65) Prior Publication Data

US 2011/0056059 A1 Mar. 10, 2011

(30) Foreign Application Priority Data

Sep. 7, 2009 (JP) .............................. 2009-206241

(51) Int. Cl.
- *H01L 41/22* (2013.01)
- *H01L 41/083* (2006.01)
- *H01L 41/09* (2006.01)
- *B41J 2/16* (2006.01)
- *H01L 41/29* (2013.01)

(52) U.S. Cl.
CPC ............ *B41J 2/161* (2013.01); *H01L 41/0973* (2013.01); *B41J 28/1629* (2013.01); *H01J 41/314* (2013.01); *B41J 2/1645* (2013.01); *B41J 2/1643* (2013.01); *B41J 2/1631* (2013.01); *B41J 28/1642* (2013.01); *B41J 2/1632* (2013.01); *H01L 41/29* (2013.01); *B41J 2/1646* (2013.01); *B41J 28/1628* (2013.01)
USPC .............. 29/25.35; 29/831; 29/846; 430/312; 430/313; 430/323; 205/163; 205/165; 310/324; 310/348; 310/365

(58) Field of Classification Search
USPC .............. 29/25.35, 890.1, 846, 831; 430/313, 430/323, 312; 205/163, 165, 166; 310/324, 310/348, 365
See application file for complete search history.

(56) References Cited

U.S. PATENT DOCUMENTS

| 4,080,246 A * | 3/1978 | Battisti et al. ............. 430/323 X |
| 6,088,893 A * | 7/2000 | Takeuchi et al. ............. 29/25.35 |
| 7,504,191 B2 | 3/2009 | Kondo et al. |
| 2001/0015001 A1* | 8/2001 | Hashizume .................. 29/25.35 |

FOREIGN PATENT DOCUMENTS

| EP | 1 365 457 A2 | 11/2003 | |
| JP | 58034981 A * | 3/1983 | ................... 29/25.35 |
| JP | 2000-200763 A1 | 7/2000 | |
| JP | 2003-179329 | 6/2003 | |

(Continued)

OTHER PUBLICATIONS

International Preliminary Report on Patentability dated Apr. 11, 2011 (with English translation).

(Continued)

*Primary Examiner* — A. Dexter Tugbang
(74) *Attorney, Agent, or Firm* — Burr & Brown, PLLC

(57) ABSTRACT

Provided is a method of producing a piezoelectric/electrorestrictive film type device including a vibrating laminate obtained by laminating electrode films and piezoelectric/electrorestrictive films on a substrate containing a cavity. The method of producing the vibrating laminate includes: producing the substrate with a cavity, forming the first photoresist film on first principal surface of substrate, irradiating substrate from the second principal surface side of the substrate, transferring the plane shape of the cavity to the first photoresist film, developing and removing the first photoresist film formed in the region where the shape of cavity was formed, forming a lowermost electrode film by plating, and forming additional films other than the lowermost electrode film constituting the vibrating laminate.

23 Claims, 58 Drawing Sheets

(56) References Cited

FOREIGN PATENT DOCUMENTS

| JP | 2004-233835 A1 | 8/2004 |
|----|----------------|--------|
| JP | 2005-197256 A1 | 7/2005 |
| JP | 3999044        | 8/2007 |
| JP | 2007-237717 A1 | 9/2007 |
| JP | 2008-023794 A1 | 2/2008 |

OTHER PUBLICATIONS

International Search Report dated Oct. 12, 2010 (with English translation).

* cited by examiner

F I G. 1 2
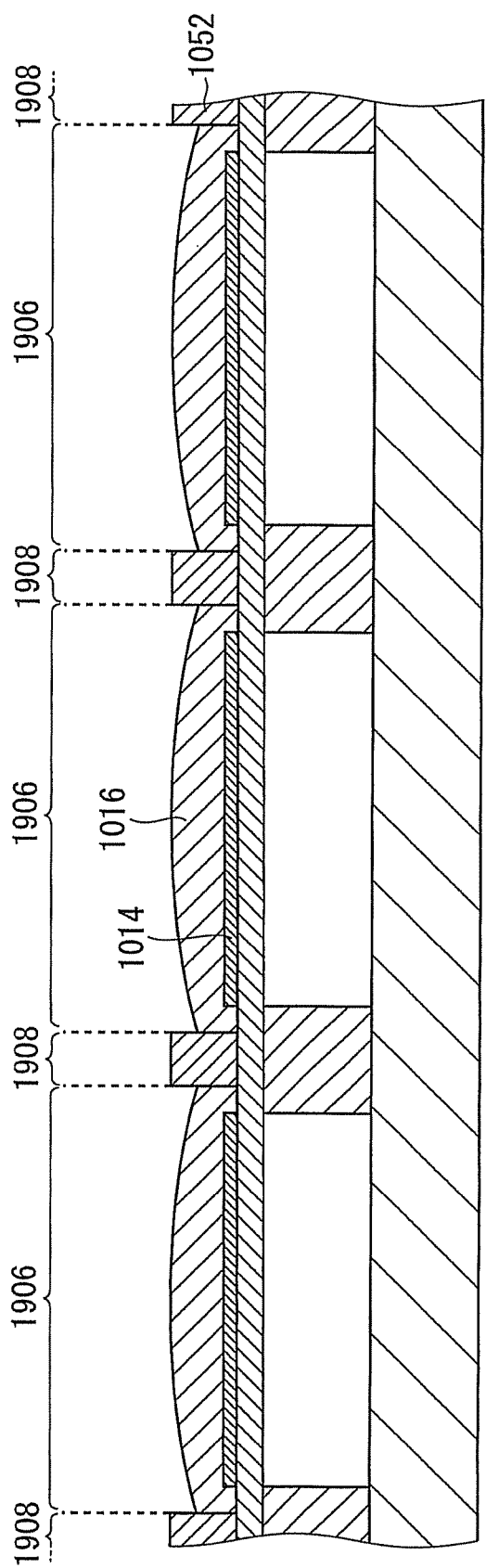

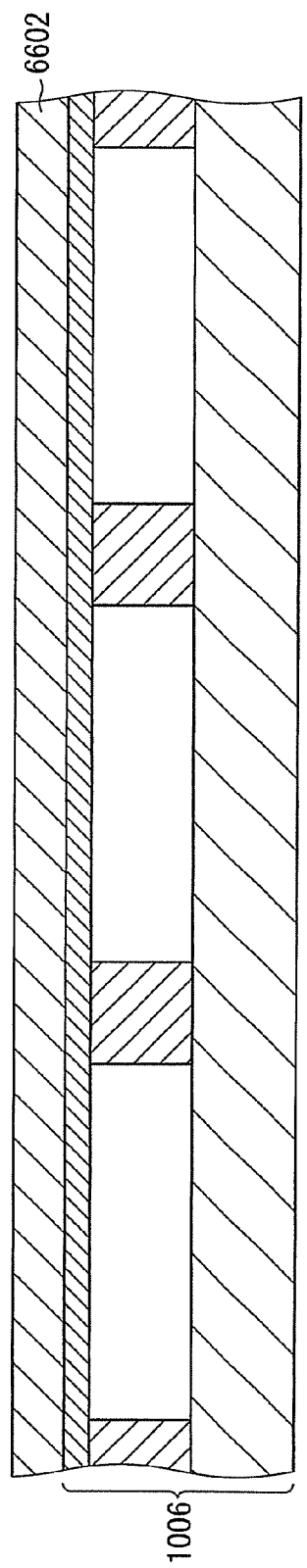

F I G. 5 7
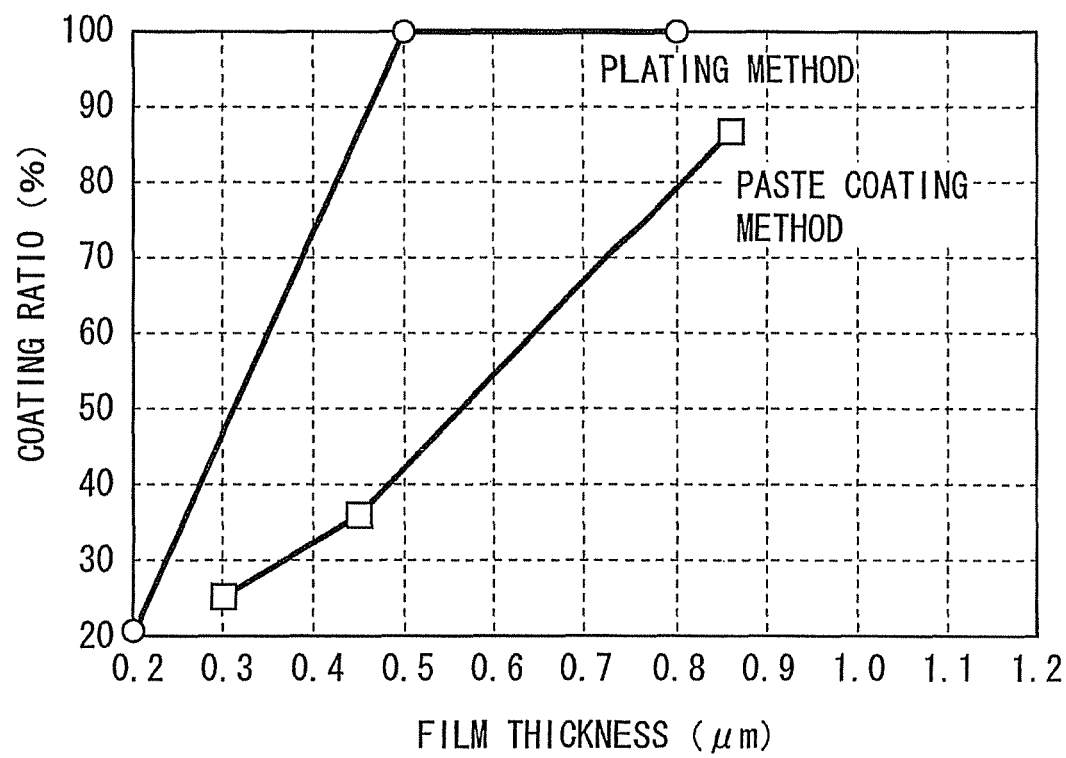

METHOD OF PRODUCING PIEZOELECTRIC/ELECTROSTRICTIVE FILM TYPE DEVICE

BACKGROUND OF THE INVENTION

1. Field of the Invention

The present invention relates to a method of producing a piezoelectric/electrostrictive film type device provided with a substrate formed with a cavity and a vibrating laminate obtained by laminating electrode films and a piezoelectric/electrostrictive film which are aligned with the plane position of the cavity, on a first principal surface of the substrate.

2. Description of Related Art

FIGS. 58A to 58C are schematic sectional views for describing a conventional method of producing a piezoelectric/electrostrictive film type device 9 constituting the essential part of an ink jetting piezoelectric/electrostrictive actuator to be used for the head of an ink jet printer.

In the conventional production method, as shown in FIG. 58A, a conductive material paste is applied by screen printing to the surface of a substrate 902 formed with a cavity 926 which is to be an ink pressure room and the obtained coating film is fired into a lower electrode film 912. Thereafter, as shown in FIG. 58B, a piezoelectric/electrostrictive material paste is applied by screen printing to the lower electrode film 912 and the obtained coating film is fired into a piezoelectric/electrostrictive film 914. Then, as shown in FIG. 58C, an electroconductive material paste is formed by screen printing on the piezoelectric/electrostrictive film 914 and the obtained coating film is fired into an upper electrode film 916.

Japanese Patent No. 3999044 discloses a method of producing an ink jetting piezoelectric/electrostrictive actuator to be used for the head of an ink jet printer.

However, the conventional production method has the problem that pores are increased in the lower electrode film by the firing performed after the lower electrode film is formed, leading to a reduction in the coating ratio of the lower electrode film. This problem is particularly significant when the film thickness of the lower electrode film is reduced to increase the amount of displacement of flexure.

In addition, the conventional production method has the problem that the plane position of the lower electrode film is deviated from the plane position of the cavity by a dimensional variation and deformation of the substrate and screen plate, causing a variation in the amount of ink to be jetted from the piezoelectric/electrostrictive actuator.

These problems are common not only to a piezoelectric/electrostrictive film type device constituting the essential part of the piezoelectric/electrostrictive actuator but also to a piezoelectric/electrostrictive film type device provided with a substrate formed with a cavity and a vibrating laminate obtained by laminating an electrode film and a piezoelectric/electrostrictive film which are aligned with the plane position of the cavity, on the surface of the substrate, such as a film bulk acoustic resonator (FBAR) having a diaphragm structure.

SUMMARY OF THE INVENTION

The present invention is directed to a method of producing a piezoelectric/electrostrictive film type device provided with a substrate formed with a cavity and a vibrating laminate obtained by laminating electrode films and a piezoelectric/electrostrictive film which are aligned with the plane position of the cavity, on a first principal surface of said substrate.

It is an object of the present invention to increase the coating ratio of the lowermost electrode film and to prevent the deviation of the plane position of the lowermost electrode film from the plane position of the cavity.

According to a first aspect of the present invention, there is provided a method of producing a piezoelectric/electrostrictive film type device including the steps of (a) producing a substrate, (b) forming a first photoresist film on a first principal surface of the substrate, (c) irradiating the substrate with light from a second principal surface side of the substrate to describe a latent image obtained by transferring the plane shape of the cavity in the first photoresist film, (d) removing the first photoresist film formed in the region where the cavity is formed, by developing to form a first photoresist film pattern, (e) forming a resinate film containing a resinate of a catalyst metal on the first principal surface of the substrate such that the resinate film is overlapped on the first photoresist film pattern, to removing the first photoresist film pattern and the resinate film formed in the region where the first photoresist film pattern is formed to form a resinate film pattern, (g) firing the resinate film pattern to form a catalyst layer pattern in which catalyst metal cores exist in a dispersed state, (h) forming a plating film on the catalyst layer pattern by electroless plating to form a lowermost electrode film constituting the vibrating laminate, and (i) forming films other than the lowermost electrode film among the electrode films and piezoelectric/electrostrictive film constituting the vibrating laminate.

This method improves the packing density of the lowermost electrode film and also, improves the heat resistance and therefore, the coating ratio of the lowermost electrode film is increased. Further, since the lowermost electrode film is formed in the region where the cavity is formed, the deviation of the plane position of the lowermost electrode film from the plane position of the cavity is limited.

According to a second aspect of the present invention, there is provided a method of producing a piezoelectric/electrostrictive film type device including the steps of (a) producing a substrate, (b) forming a first photoresist film on a first principal surface of the substrate, (c) irradiating the substrate with light from a second principal surface side of the substrate to describe a latent image obtained by transferring the plane shape of the cavity in the first photoresist film, (d) removing the first photoresist film formed in the region where the cavity is formed, by developing to form a first photoresist film pattern, (e) forming a catalyst layer in which catalyst metal cores exist in a dispersed state on the first principal surface of the substrate such that the catalyst layer is overlapped on the first photoresist film pattern, (f) forming a plating film on the catalyst layer by electroless plating, (g) removing the first photoresist film pattern, and the catalyst layer and plating film formed in the region where the first photoresist film pattern is formed, to form a lowermost electrode film constituting the vibrating laminate, and (h) forming films other than the lowermost electrode film among the electrode films and piezoelectric/electrostrictive film constituting the vibrating laminate.

This method improves the heat resistance of the lowermost electrode film and therefore, the coating ratio of the lowermost electrode film is increased. Further, since the lowermost electrode film is formed in the region where the cavity is formed, the deviation of the plane position of the lowermost electrode film from the plane position of the cavity is limited.

According to a third aspect of the present invention, there is provided a method of producing a piezoelectric/electrostrictive film type device including the steps of (a) producing a substrate, (b) forming a first photoresist film on a first principal surface of the substrate, (c) irradiating the substrate with light from a second principal surface side of the substrate to describe a latent image obtained by transferring the plane shape of the cavity in the first photoresist film, (d) removing the first photoresist film formed in the region where the cavity is not formed, by developing to form a first photoresist film pattern, (e) forming a water-repellent film on the first principal surface of the substrate such that the water-repellent film is overlapped on the first photoresist film pattern, (f) removing the first photoresist film pattern and the water-repellent film formed in the region where the first photoresist pattern is formed, to form a water-repellent film pattern, (g) forming a resinate film containing a catalyst metal resinate on the first principal surface of the substrate such that the resinate film is overlapped on the water-repellent film pattern, (h) removing the water-repellent film pattern to form a resinate film pattern, (i) firing the resinate film pattern to form a catalyst layer pattern in which catalyst metal cores exist in a dispersed state, (j) forming a plating film on the catalyst layer pattern by electroless plating to form a lowermost electrode film constituting the vibrating laminate, and (k) forming films other than the lowermost electrode film among the electrode films and piezoelectric/electrostrictive film constituting the vibrating laminate.

This method improves the heat resistance of the lowermost electrode film and therefore, the coating ratio of the lowermost electrode film is increased. Further, since the lowermost electrode film is formed in the region where the cavity is formed, the deviation of the plane position of the lowermost film from the plane position of the cavity is limited. Moreover, since the lowermost electrode film is repelled by the water-repellent film, the end tail projection at the end of the lowermost electrode film is limited.

According to a fourth aspect of the present invention, there is provided a method of producing a piezoelectric/electrostrictive film type device including the steps of (a) producing a substrate, (b) forming a first photoresist film on a first principal surface of the substrate, (c) irradiating the substrate with light from a second principal surface side of the substrate to describe a latent image obtained by transferring the plane shape of the cavity in the first photoresist film, (d) removing the first photoresist film formed in the region where the cavity is not formed, by developing to form a first photoresist film pattern, (e) forming a water-repellent film on the first principal surface of the substrate such that the water-repellent film is overlapped on the first photoresist film pattern, (f) removing the first photoresist film pattern and the water-repellent film pattern formed in the region where the first photoresist pattern is formed, to form a water-repellent film pattern, (g) forming a catalyst layer in which catalyst metal cores exist in a dispersed state on the first principal surface of the substrate such that the catalyst layer is overlapped on the water-repellent film pattern, (h) forming a plating film on the catalyst layer by electroless plating, (i) removing the water-repellent film pattern and the catalyst layer and plating film formed in the region where the water repellent film pattern is formed to form a lowermost electrode film constituting the vibrating laminate, and (j) forming films other than the lowermost electrode film among the electrode films and piezoelectric/electrostrictive film constituting the vibrating laminate.

This method improves the heat resistance of the lowermost electrode film and therefore, the coating ratio of the lowermost electrode film is increased. Further, since the lowermost electrode film is formed in the region where the cavity is formed, the deviation of the plane position of the lowermost film from the plane position of the cavity is limited. Moreover, since the lowermost electrode film is repelled by the water-repellent film, the end tail projection at the end of the lowermost electrode film is limited.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 to 15 are views for describing a method of producing a piezoelectric/electrostrictive film type device according to the first preferred embodiment;

FIGS. 51 to 56 are views for describing a method of forming a water-repellent film pattern according to sixth preferred embodiment;

FIG. 57 is a graph for comparing the coating ratio of a lower electrode film after heat treatment.

DETAILED DESCRIPTION OF THE INVENTION

First Preferred Embodiment

In a first preferred embodiment, which relates to a method of producing a piezoelectric/electrostrictive film type device provided with a substrate formed with a cavity and an vibrating laminate obtained by laminating a lower electrode film, a piezoelectric/electrostrictive film, an upper electrode film which are aligned with the plane position of the cavity, on the surface of the substrate, the lower electrode film is formed by using, as a mask, the substrate in which the cavity is filled with a light-shielding agent according to photolithography. Thereafter, a powder of piezoelectric/electrostrictive material is made to flow towards the lower electrode film by electrophoresis to form a piezoelectric/electrostrictive film and then, an upper electrode film is formed using the piezoelectric/electrostrictive material as a mask according to the photolithography.

<1.1 Structure of Piezoelectric/Electrostrictive Film Type Device 1002>

Figure 1:
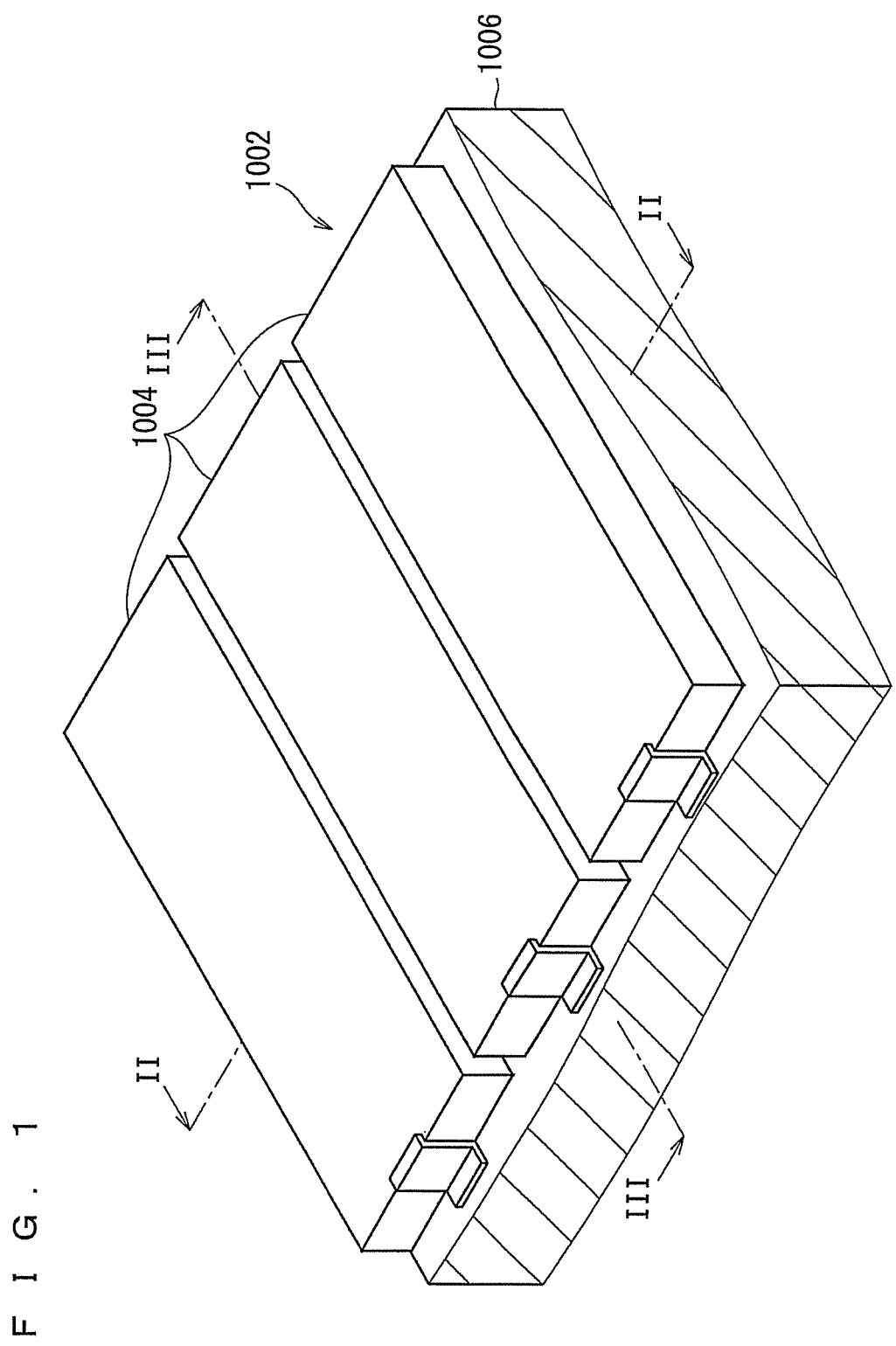
FIG. 1 is a perspective view showing a structure of a piezoelectric/electrostrictive film type device produced by a method of producing a piezoelectric/electrostrictive film type device according to a first preferred embodiment.
Figure 2:
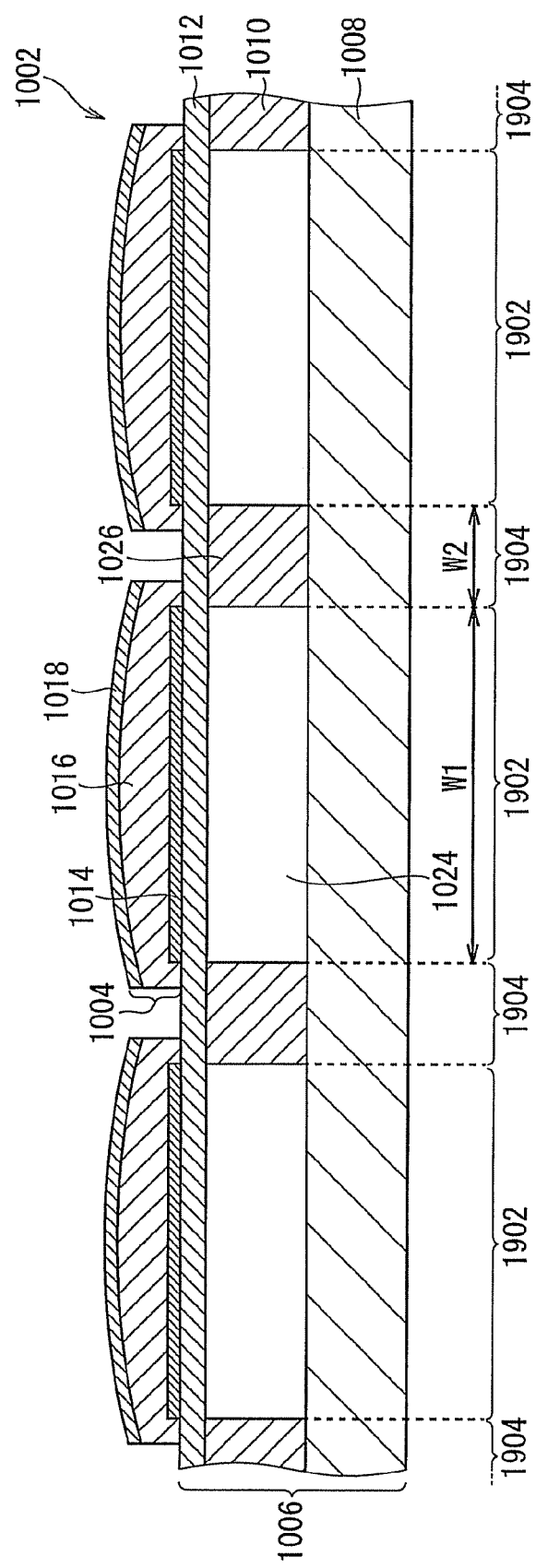
FIG. 2 is a sectional view of the piezoelectric/electrostrictive film type device taken along line I-I of FIG. 1.
Figure 3:
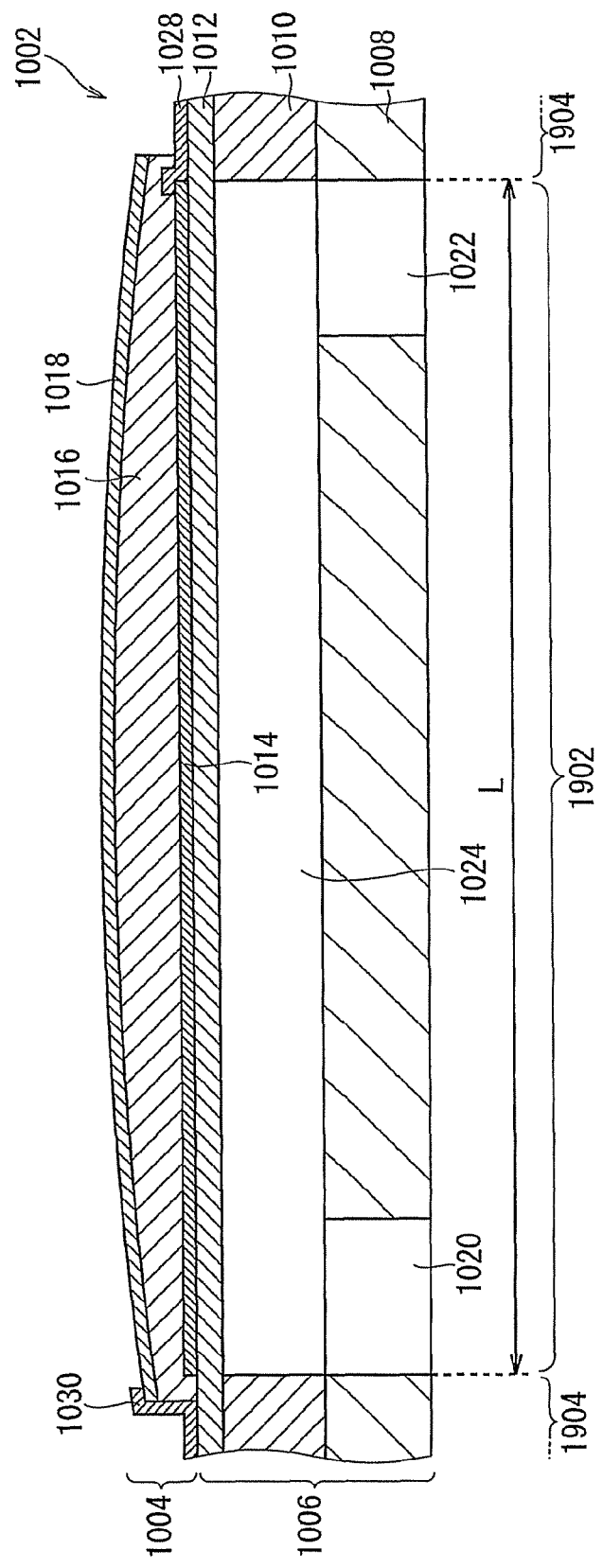
FIG. 3 is a sectional view of the piezoelectric/electrostrictive film type device taken along line II-II of FIG. 1.

FIGS. 1 to 3 are schematic views each showing a outline structure of a piezoelectric/electrostrictive film type device 1002 manufactured by the method of producing a piezoelectric/electrostrictive film type device according the first preferred embodiment of the present invention. FIG. 1 is a perspective view of the piezoelectric/electrostrictive film type device 1002, FIG. 2 is a sectional view of the piezoelectric/electrostrictive film type device 1002 taken along line II-II of FIG. 1, and FIG. 3 is a sectional view of the piezoelectric/electrostrictive film type device 1002 taken along line III-III of FIG. 1. The piezoelectric/electrostrictive film type device 1002 constitutes the essential part of the piezoelectric/electrostrictive actuator for ink jetting which is used for the head of an ink jet printer. However, the following method of producing a piezoelectric/electrostrictive film type device may also be utilized for the production of other types of piezoelectric/electrostrictive film type devices.

As shown in FIGS. 1 to 3, the piezoelectric/electrostrictive film type device 1002 has a structure in which plural vibrating laminates 1004 are regularly arranged on the surface of a substrate 1006. However, the following method of producing a piezoelectric/electrostrictive film type device may also be utilized for the production of a piezoelectric/electrostrictive film type device provided with only one vibrating laminate 1004.

As shown in FIGS. 2 and 3, the piezoelectric/electrostrictive film type device 1002 has a sectional structure in which the vibrating laminate 1004 obtained by laminating a lower electrode film 1014, a piezoelectric/electrostrictive film 1016 and an upper electrode film 1018 in this order from bottom to top is formed on the surface of the substrate 1006 in which a base plate 1008, a base plate 1010 and an vibrating plate 1012 are laminated in this order from bottom to top.

{Substrate 1006}

The substrate 1006 is a fired body of an insulating ceramics. The insulating ceramics preferably contains at least one type selected from the group consisting of zirconium oxide, aluminum oxide, magnesium oxide, mullite, aluminum nitride and silicon nitride from the viewpoint of heat resistance, chemical stability and insulating ability, though no particular limitation is imposed on the type of insulating ceramics. Among these materials, stabilized zirconium oxide is preferable from the viewpoint of mechanical strength and toughness. Here, the term "stabilized zirconium oxide" means zirconium oxide in which the phase transition of a crystal is limited by adding a stabilizer, and includes, besides stabilized zirconium oxide, partially stabilized zirconium oxide.

The base plate 1008 has a structure in which an ink jetting hole 1020 and an ink supply hole 1022 each having a circular plane shape are formed in a plate having an almost uniform thickness. The ink jetting hole 1020 is formed in the vicinity of one end of a region (hereinafter referred to as a "cavity region") 1902 where a cavity 1024 (which will be described later) is formed and the ink supply hole 1022 is formed in the vicinity of the other end of the cavity region 1902.

The base plate 1010 has a structure in which a cavity 1024 having an elongated rectangular plane shape is formed in a plate having an almost uniform thickness. The width W1 of the short side of the cavity 1024 is preferably made larger, and is, specifically, 50 μm or more to increase the amount of displacement of flexure which will be described later to thereby increase the volume to be excluded. However, if the width W1 of the cavity 1024 is too large, this brings about an excessively largely spaced array of the vibrating laminates 1004 and therefore, the width W1 of the cavity 1024 is preferably 100 μm or less. The length L of the long side of the cavity 1024 is preferably shorter, and is, specifically, 3 mm or less to reduce flow resistance. The width W2 of a frame 1026 extended between the neighboring cavities 1024 is preferably smaller, and is, specifically, 100 μm or less to increases the amount of displacement of flexure to thereby increase the volume to be excluded.

The plane shape of the cavity 1024 is not limited to an elongated rectangular form. In other words, the plane shape of the cavity 1024 may be a polygonal form such as a triangle or square form, or a two-dimensional form, such as a circular or elliptical form in which a part of the profile is curved. Further, it is unessential to arrange the cavities 1024 in one direction and for example, the cavities 1024 may be arranged latticewise in two orthogonal directions.

The vibrating plate 1012 is a plate having an almost uniform thickness. The plate thickness of the vibrating plate 1012 is preferably 1 μm or more and 30 μm or less and more preferably 1 μm or more and 15 μm or less. This reason is that if the thickness of the vibrating plate 1012 is less than these ranges, the vibrating plate is easily damaged whereas if the thickness of the vibrating plate 1012 exceeds these ranges, the rigidity of the vibrating plate 1012 is high, so that the amount of displacement of flexure tends to decrease. It is unessential that the vibrating plate 1012 is flat and even if the vibrating plate 1012 has slight irregularities and warpage, the following method of producing a piezoelectric/electrostrictive film type device is adopted.

The laminate structure of the base plate 1008, base plate 1010 and vibrating plate 1012 allows the cavity 1024 to form a hollow space which is isolated from the surface side by the vibrating plate 1012 and from the backside by the base plate 1010 inside of the substrate 1006 and to function as an ink room which stores ink. Also, the ink jetting hole 1020 is communicated with the cavity 1024 and functions as a path for ink flowed from the cavity 1024. Moreover, the ink supply hole 1022 is also communicated with the cavity 1024 and functions as a path for ink flowed into the cavity 1024.

The sum of the plate thicknesses of the base plate 1008, base plate 1010 and vibrating plate 1012 is so determined that the exposure light transmitted therefrom is sufficient as will be described later. What order to select as the sum of plate thicknesses for sufficient transmission of exposure light, of course, varies depending on the type of insulating ceramics and the density of the fired body.

{Vibrating Laminate 1004}

The lower electrode film 1014 is a plating precipitate of a conductive material. The upper electrode film 1018 is a sintered body of a conductive material. The upper electrode film 1018 may be a plating precipitate of a conductive material. Though no particular limitation is imposed on the type of conductive material, a metal such as platinum, palladium, rhodium, gold or silver or an alloy containing each of these metals as its major component is preferable from the viewpoint of electric resistance and heat resistance. Among these materials, platinum or an alloy containing platinum as its major component which is particularly superior in heat resistance is preferable.

The film thickness of the lower electrode film 1014 is preferably 0.1 μm or more and 5.0 μm or less and the film thickness of the upper electrode film 1018 is preferably 0.1

µm or more and 3.0 µm or less. This reason is that when each thickness of these electrode films exceeds these ranges, the rigidity of the lower electrode film 1014 and upper electrode film 1018 is increased and the amount of displacement of flexure tends to decrease, whereas when each thickness of these electrode films is less than these ranges, the electric resistance of each of these electrode films 1014 and 1018 tends to increase and these electrode films 1014 and 1018 tend to be open.

The lower electrode film 1014 and the upper electrode film 1018 are preferably formed in such a manner as to cover the region which substantially contributes to the displacement of flexure of the piezoelectric/electrostrictive film 1016. For example, these electrode films are preferably formed in such a manner as to cover a region 80% or more of the upper surface and lower surface of the piezoelectric/electrostrictive film 1016 including the center part of the piezoelectric/electrostrictive film 1016.

The piezoelectric/electrostrictive film 1016 is a sintered body of piezoelectric/electrostrictive ceramics. Although no particular limitation is imposed on the type of piezoelectric/electrostrictive ceramics, the material of the ceramics is preferably a lead (Pb) type perovskite oxide and more preferably lead zirconate titanate (PZT; $Pb(Zr_xTi_{1-x})O_3$) or modified products obtained by introducing a simple oxide or complex perovskite oxide into lead zirconate titanate from the viewpoint of electric field inductive strain. Among these materials, ceramics obtained by introducing nickel oxide (NiO) into a solid solution of lead zirconate titanate and lead magnesium niobate ($Pb(Mg_{1/3}Nb_{2/3})O_3$) and a solid solution of lead zirconate titanate and a lead salt of nickel acid and niobium acid ($Pb(Ni_{1/3}Nb_{2/3})O_3$) are preferable.

The film thickness of the piezoelectric/electrostrictive film 1016 is preferably 1 µm or more and 20 µm or less. This is because when the film thickness is less than this range, the piezoelectric/electrostrictive film 1016 tend to be insufficiently densified, whereas when the film thickness exceeds this range, it is necessary to increase the thickness of the vibrating plate 1012 because the shrinkage stress of the piezoelectric/electrostrictive film 1016 in the firing is increased.

Moreover, the vibrating laminate 1004 is provided with a lower wire electrode 1028 which is to be a power feed path to the lower electrode film 1014 and an upper wire electrode 1030 which is to be a power feed path to the upper electrode film 1018. One end of the lower wire electrode 1028 is disposed between the lower electrode film 1014 and the piezoelectric/electrostrictive film 1016 and is electrically connected to one end of the lower electrode film 1014 and the other end of the lower wire electrode 1028 is disposed in a non-cavity region 1904 out of the cavity region 1902. One end of the upper wire electrode 1030 is disposed above the upper electrode film 1018 and is electrically connected to one end of the upper electrode film 1018 and the other end of the upper wire electrode film 1018 is disposed in the non-cavity region 1904.

When the vibrating laminate 1004 is provided with the lower wire electrode 1028 and the upper wiring electrode 1030 and drive signals are fed to the power feed point positioned in the non-cavity region 1904 of the lower wire electrode 1028 and upper wire electrode 1030, an electric field is applied to the piezoelectric/electrostrictive film 1016 without affecting flexural vibration which will be described later.

The vibrating laminate 1004 is integrated with the vibrating plate 1012 above the cavity 1024. Such a structure ensures that when drive signals are fed between the lower electrode film 1014 and the upper electrode film 1018 through the lower wire electrode 1028 and upper wire electrode 1030 to apply an electric field to the piezoelectric/electrostrictive film 1016, the piezoelectric/electrostrictive film 1016 is expanded and shrunk in a direction parallel to the surface of the substrate 1006, causing the flexural displacement of the integrated piezoelectric/electrostrictive film 1016 and vibrating plate 1012. Ink inside of the cavity 1024 is jetted towards the outside through the ink jetting hole 1020 by this flexural displacement.

<1.2 Method of Producing Piezoelectric/Electrostrictive Film Type Device>

FIGS. 4 to 15 are schematic views for describing the method of producing the piezoelectric/electrostrictive film type device according to the first preferred embodiment. FIGS. 4 to 15 are sectional views of the half-finished product of the piezoelectric/electrostrictive film type device 1002.

{Production of Substrate 1006}

Figure 4:
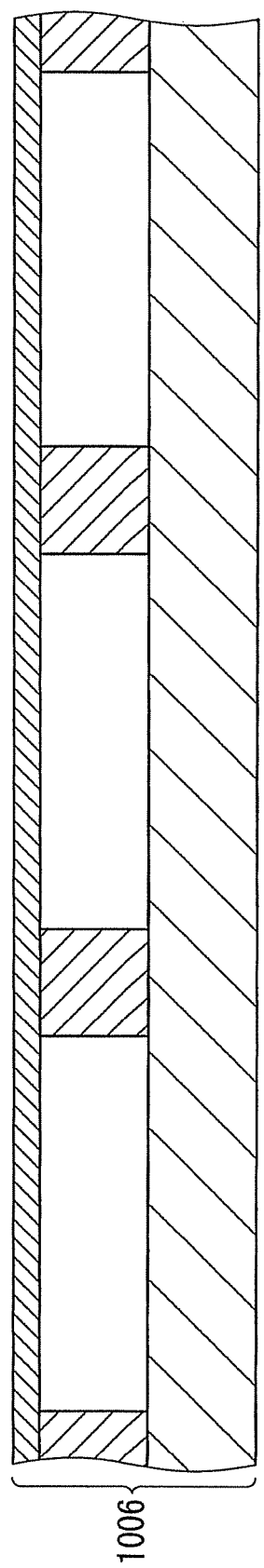

In the method of producing a piezoelectric/electrostrictive film type device 1002 according to the first preferred embodiment, the substrate 1006 is produced as shown in FIG. 4. The substrate 1006 is produced, for example, by crimping a green sheet obtained by molding insulating ceramics into a sheet, followed by firing.

{Formation of Lower Electrode Film 1014}

Figure 5:
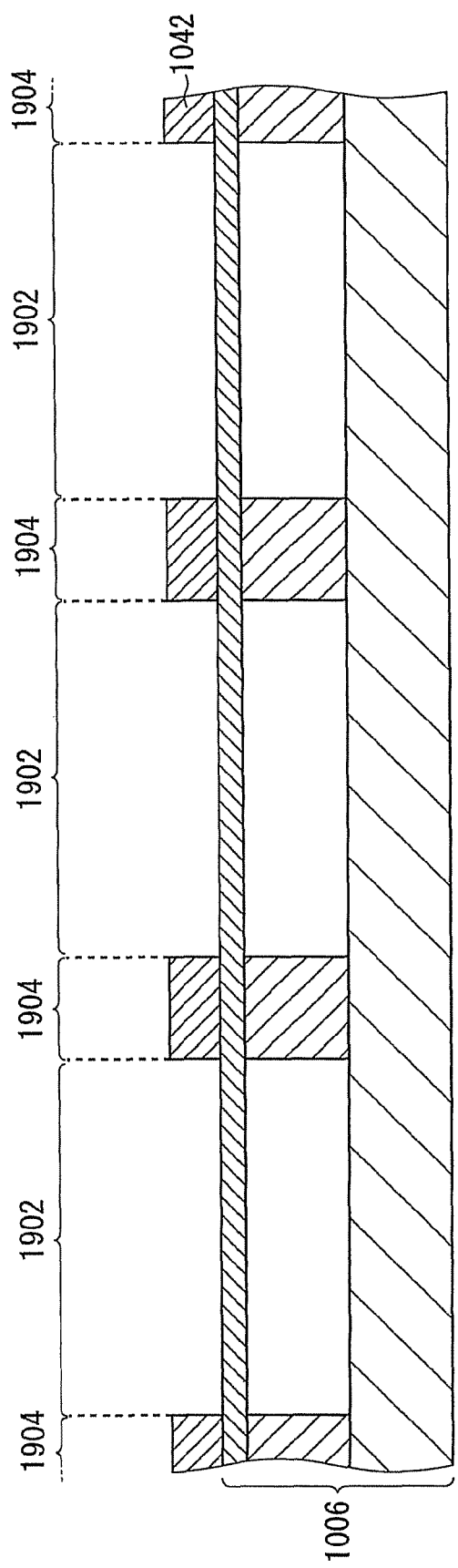

In succession, as shown in FIG. 5, a resist film pattern 1042 which does not cover the cavity region 1902 but covers the non-cavity region 1904 is formed on the surface of the substrate 1006. The resist film pattern 1042 is formed by patterning the resist film covering the surface of the substrate 1006 by photolithography using the substrate 1006 as a mask.

Figure 6:
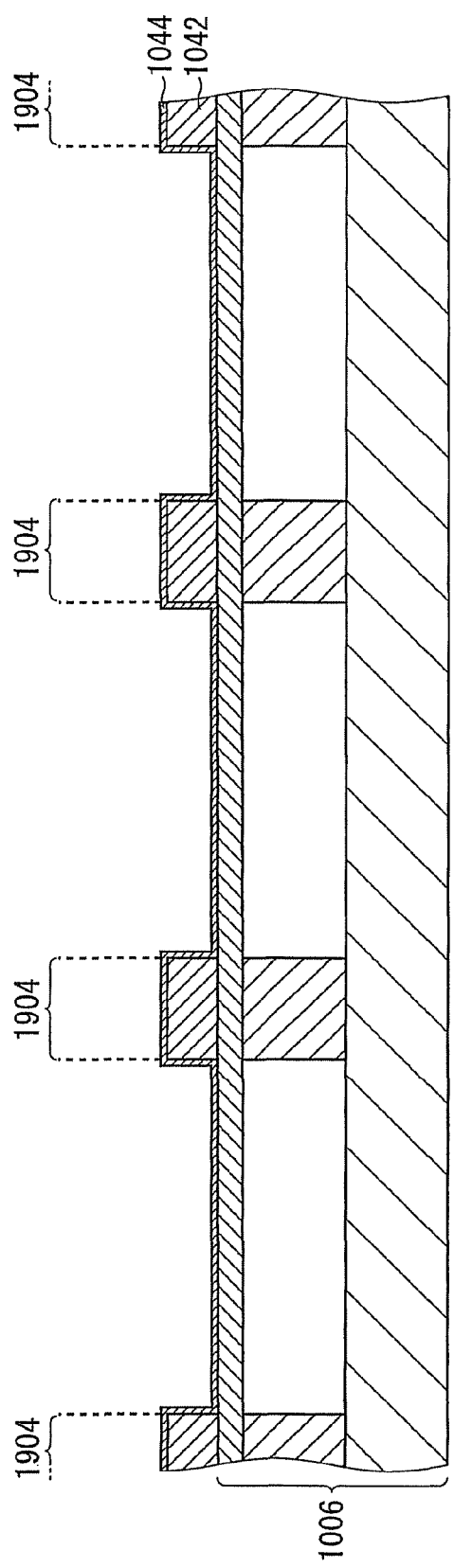
Figure 7:
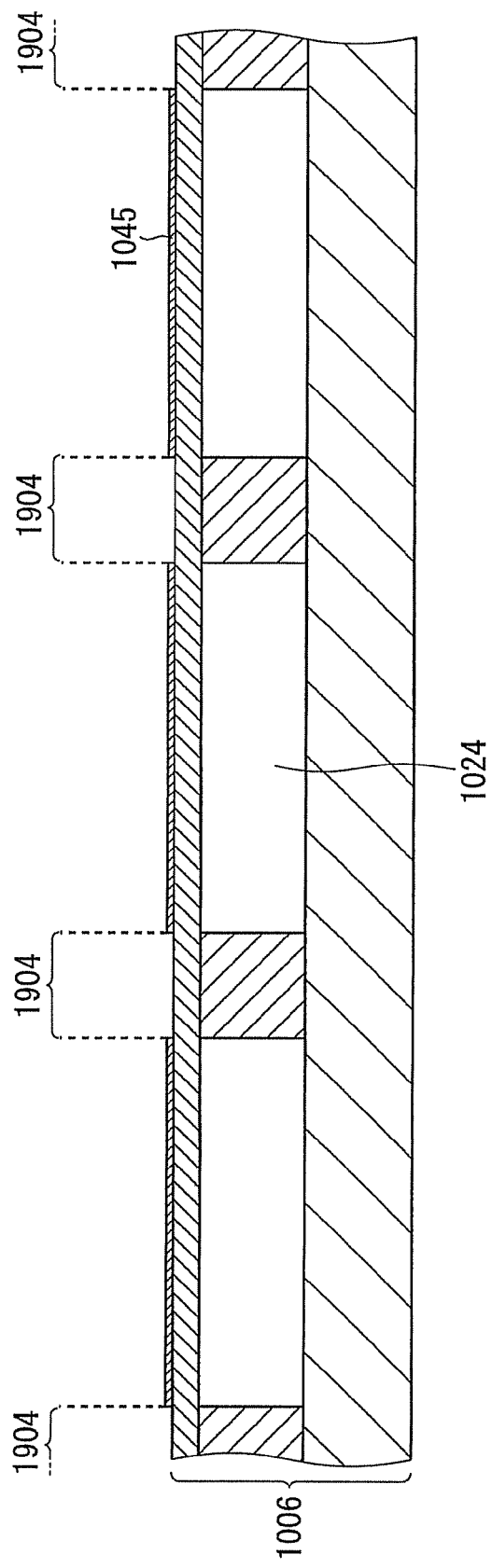

After the resist film pattern 1042 is formed, a resinate film 1044 is formed on the surface of the substrate 1006 such that it is overlapped on the resist film pattern 1042 as shown in FIG. 6. There is no problem even if the resinate film 1044 overflows into the non-cavity region 1904 because the resist film pattern 1042 is be removed afterward. Also, there is no problem even if the resinate film 1044 is imperfectly formed on the non-cavity region 1904.

The resinate film 1044 is formed by applying a solution containing a resinate of a catalyst metal (hereinafter referred to as a "catalyst metal resinate solution"), followed by removing a solvent. The catalyst metal resinate solution is applied by, for example, spin coating or spraying. Typically, platinum (Pt), palladium (Pd) or the like is selected as the catalyst metal though an appropriate material is selected according to the type of a conductive material to be electroless-plated.

After the resinate film 1044 is formed, the resist film pattern 1042 and the resinate film 1044 formed in the region where the resist film pattern 1042 is formed are removed. A resinate film pattern 1045 having the same plane shape as the cavity 1024 is formed on the same plane position as the cavity 1024. The resist film pattern 1042 is peeled by the chemical solution method. As the chemical solution to be used for the peeling of the resist film pattern 1042, an organic solvent, hydrazine type or non-hydrazine type strong alkali etching solution or the like is typically selected though it is selected corresponding to the photosensitive material of the resist film pattern 1042. Alternatively, the resist film pattern 1042 may be peeled by the heat treating method, plasma treating method or the like. When the resist film pattern 1042 is peeled by the heat treating method, the treating temperature is preferably 500° C. or more.

In the case where a residue is left after the resist film pattern 1042 is peeled off, washing gas is jetted towards the half-finished product, a gritting agent powder is sprayed on the half-finished product, or the half-finished product is washed with a washing liquid or dipped in a washing liquid to thereby remove the residue.

When the resist film pattern 1042 is peeled before firing the resinate film pattern 1045, the influence of the resist film pattern 1042 on a catalyst layer pattern 1046 which will be described later when the resinate film pattern 1045 is fired is limited.

Figure 8:
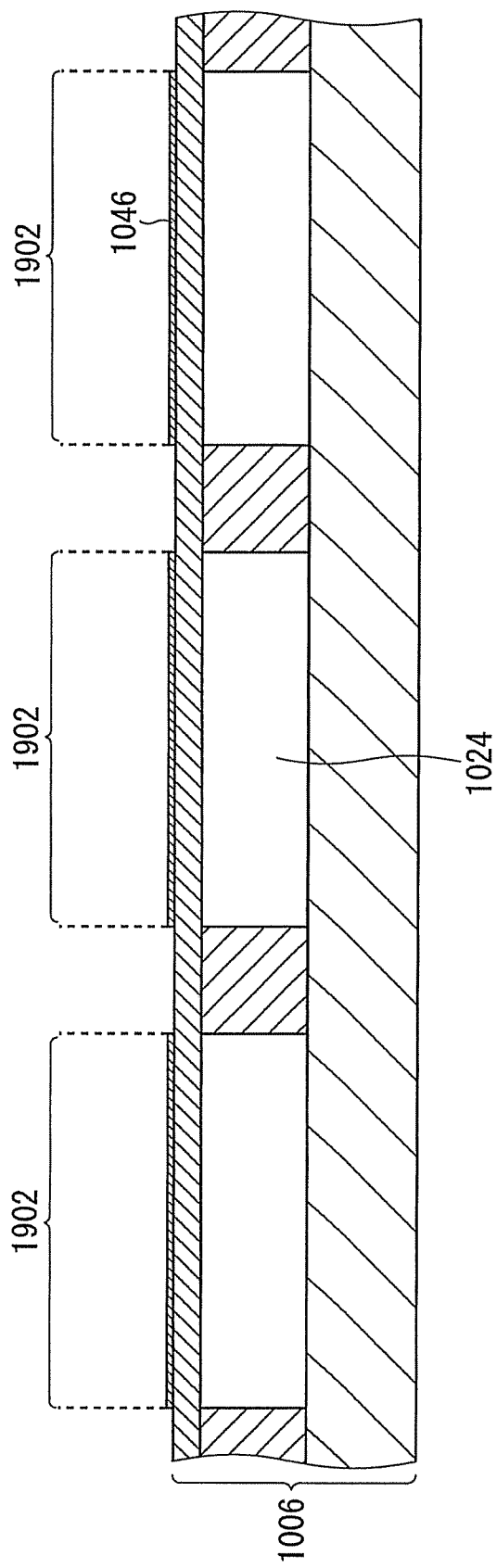

After the resist film pattern 1042 is removed, the resinate film pattern 1045 is fired as shown in FIG. 8. This ensures the formation of the catalyst layer pattern 1046 having the same plane shape as the cavity 1024 on the same plane position as the cavity 1024. The term "catalyst layer" means a layer in which catalyst metal cores exist in a dispersed state in a plane. In the cavity region 1902 where the catalyst layer pattern 1046 is formed, the catalyst metal cores which are the start points of the precipitation of the conductive material are adsorbed. The firing is performed at a temperature at which the resinate is decomposed and microparticles which are to be the catalyst metal cores are precipitated. Therefore, the firing temperature is selected according to the type of resinate. However, the resinate film pattern 1045 is typically fired at 200 to 1300° C.

In order to form the catalyst layer pattern 1046 in which catalyst metal cores exist in a dispersed state, that is, in order not to form a perfect catalyst metal coating, the amount of the catalyst metal contained in the resinate film 1044 is not made to be excessive. In the case where the film thickness of the resinate film 1044 is, for example, 3 to 10 μm, the content of the catalyst metal in the catalyst metal resinate solution is preferably 0.1% by weight or more and 20% by weight or less.

Figure 9:
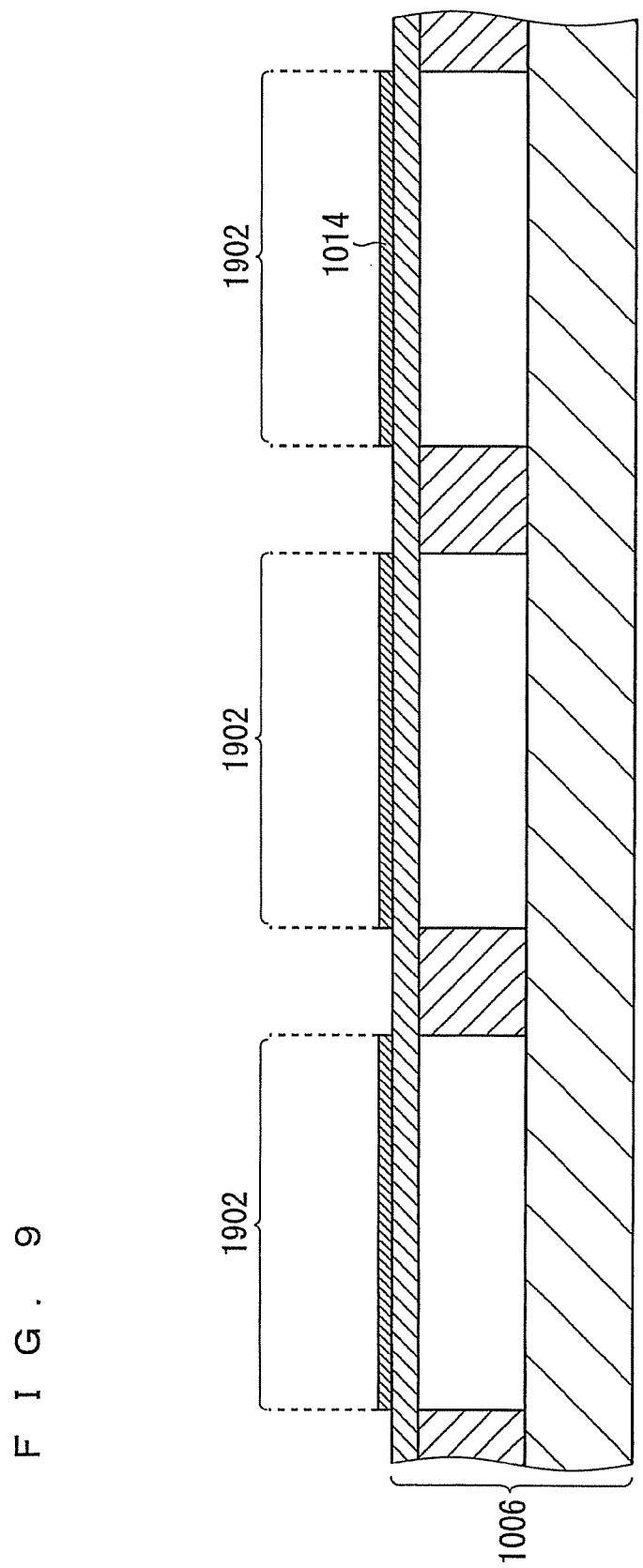

After the catalyst layer pattern 1046 is formed, a plating film is formed on the catalyst layer pattern 1046 by electroless plating. Thus, the lower electrode film 1014 is formed as shown in FIG. 9.

In the electroless plating, the conductive material is precipitated from a plating solution after the catalyst layer pattern 1046 is reduced. The catalyst layer pattern 1046 is reduced by, for example, dipping the half-finished product in a reducing agent solution to bring the reducing agent solution into contact with the catalyst layer pattern 1046. As the reducing agent solution, for example, an aqueous composed solution of sodium hydroxide and sodium borohydride is used. The precipitation of the conductive material from the plating solution is accomplished by bringing the plating solution into contact with the catalyst layer pattern 1046 which is reduced and activated when the half-finished product is dipped in the plating solution.

At this time, if the plate thickness of the vibrating plate 1012 is as thin as 30 μm or less, the lower electrode film 1014 is uniformly formed in the cavity region 1902 because the surface temperature of the substrate 1006 is uniformed in the cavity region 1902.

{Formation of Piezoelectric/Electrostrictive Film 1016}

Figure 10:
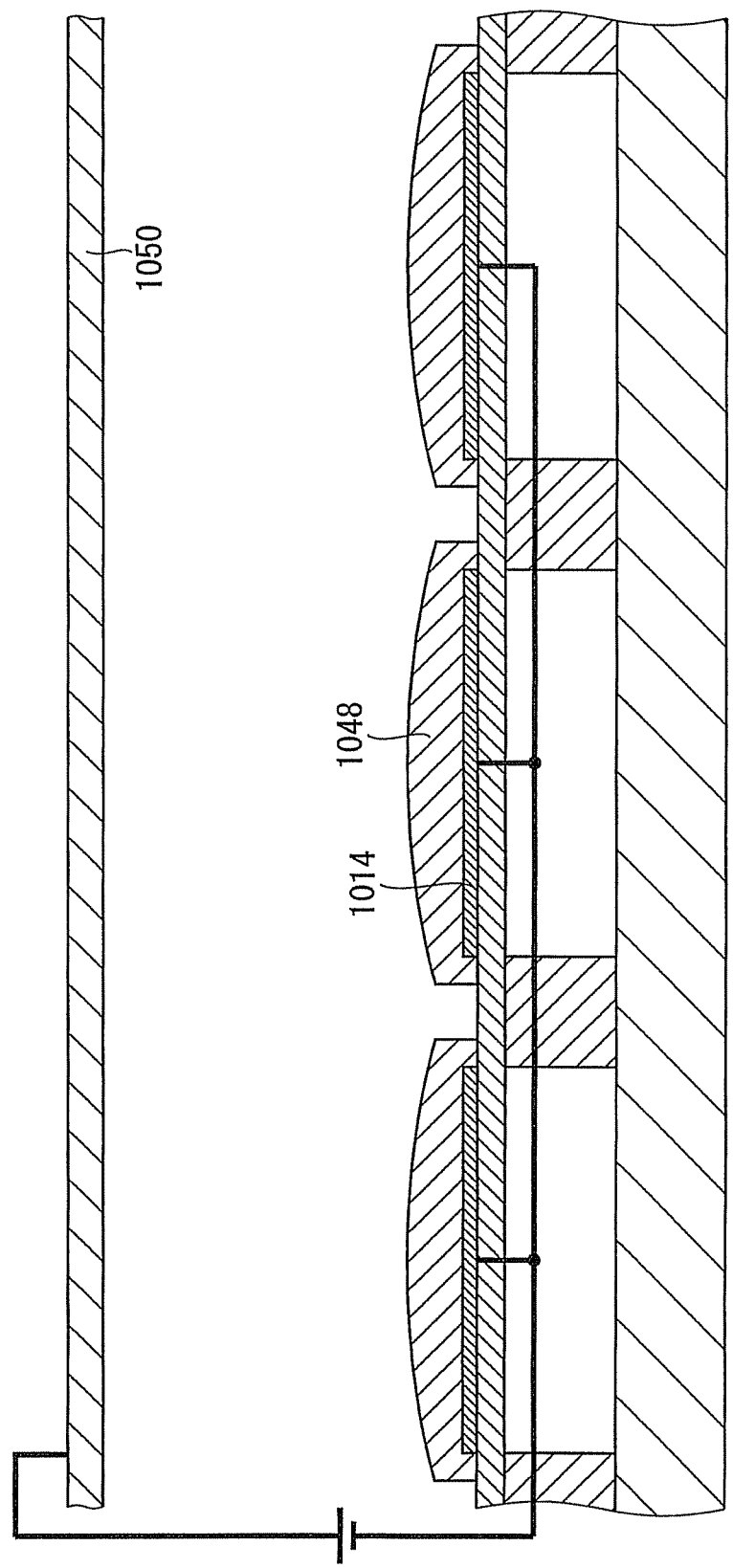

In succession, as shown in FIG. 10, a piezoelectric/electrostrictive material film 1048 which is to be the piezoelectric/electrostrictive film 1016 is formed. The piezoelectric/electrostrictive material film 1048 is formed by dipping the half-finished product and a counter electrode 1050 spaced away from each other in a slurry in which a piezoelectric/electrostrictive material is dispersed in a dispersing medium and also, voltage is applied to the lower electrode film 1014 and counter electrode 1050 to thereby allow the piezoelectric/electrostrictive material to move towards the lower electrode film 1014 by electrophoresis as shown in FIG. 10. Thus, the piezoelectric/electrostrictive material film 1048 having a plane shape slightly larger than the lower electrode film 1014 on the same plane position as the lower electrode film 1014 is formed.

At this time, it is preferable that regions where it is not necessary to form the piezoelectric/electrostrictive film 1048, such as the region where the lower wire electrode 1028 is formed be masked with an organic protective film or the like and an unnecessary piezoelectric/electrostrictive material be removed together with the organic protective film after the piezoelectric/electrostrictive material film 1048 is formed. The formation of the piezoelectric/electrostrictive material film 1048 on the lower wire electrode 1028 is prevented by this treatment.

Figure 11:
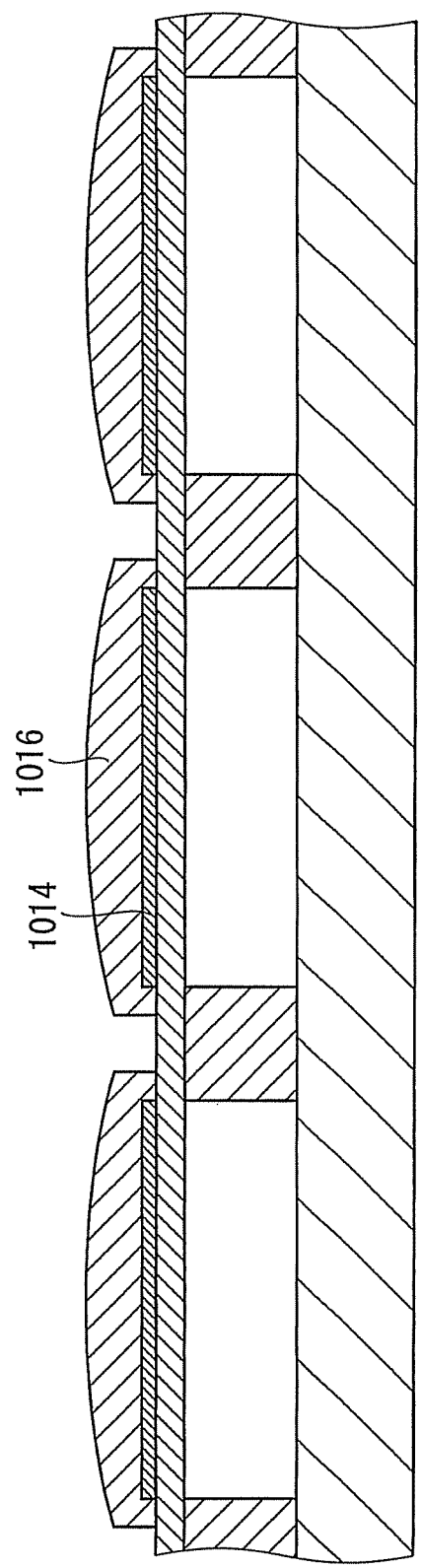

After the piezoelectric/electrostrictive material film 1048 is formed, it is fired. As shown in FIG. 11, the piezoelectric/electrostrictive material film 1048 is thereby made into a piezoelectric/electrostrictive film 1016 and the piezoelectric/electrostrictive film 1016 having a plane shape slightly larger than the lower electrode film 1014 on the same plane position as the lower electrode film 1014 is formed. In this case, slight shrinkage caused by firing is allowed. The piezoelectric/electrostrictive material film 1048 is preferably fired in the condition that the half-finished product is received in, for example, an alumina or magnesia container.

{Formation of Upper Electrode Film 1018}

After the piezoelectric/electrostrictive material film 1048 is fired, as shown in FIG. 12, a resist film pattern 1052 which does not cover a region 1906 (hereinafter referred to as "piezoelectric/electrostrictive region") where the piezoelectric/electrostrictive film 1016 is formed but covers a non-piezoelectric/electrostrictive region 1908 outside of the piezoelectric/electrostrictive material region 1906 is formed on the surface of the substrate 1006. The resist film pattern 1052 is formed by patterning the resist film covering the surface of the substrate 1006 by photolithography using the piezoelectric/electrostrictive film 1016 as a mask.

At this time, the lower wire electrode 1028 works as a mask and therefore, the resist film pattern 1052 is not formed on the lower wire electrode 1028. Therefore, it is preferable to mask a region where it is not necessary to form the upper electrode film 1018, such as the region where the lower wire electrode 1028 is formed, with an organic protective film and then to remove the organic protective film before, after or when the resist film pattern 1052 is removed. This prevents the formation of the upper electrode film 1018 on the lower wire electrode 1028.

Figure 13:
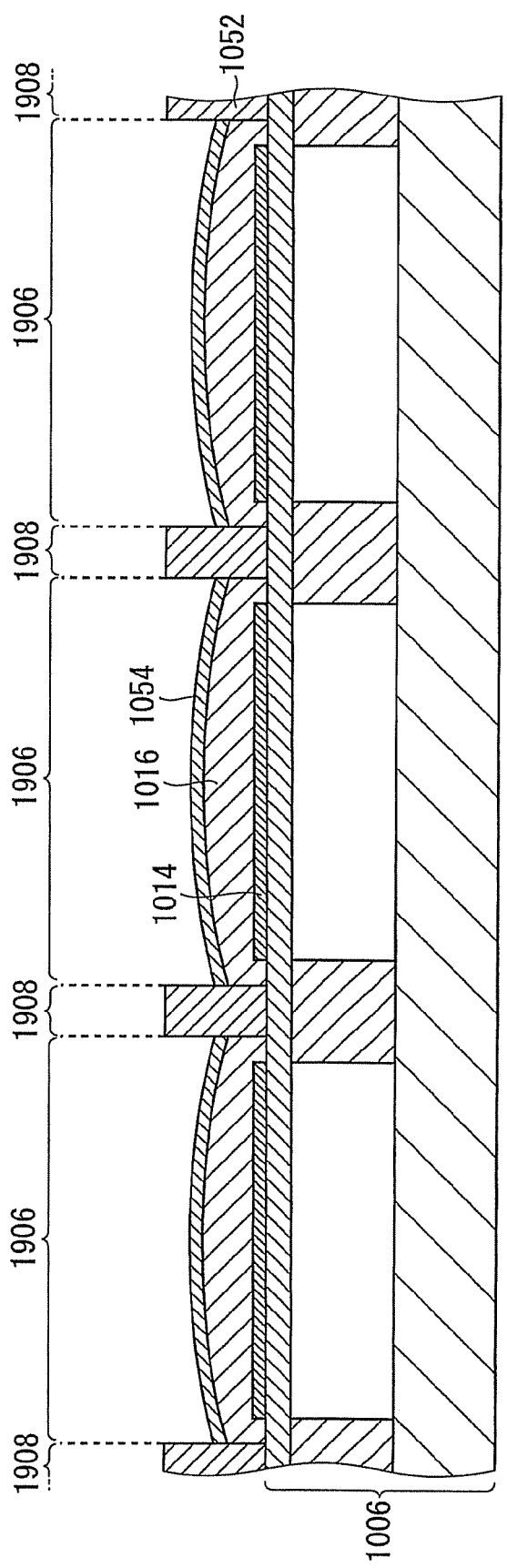

After the resist film pattern 1052 is formed, as shown in FIG. 13, a conductive material film 1054 which is to be the upper electrode film 1018 is overlapped and formed on the piezoelectric/electrostrictive film 1016 in the piezoelectric/electrostrictive region 1906 where the resist film pattern 1052 is not formed on the surface of the substrate 1006. In this case, there is no problem even if the conductive material film 1054 overflows into the non-piezoelectric/electrostrictive region 1908 because the resist film pattern 1052 is removed afterward. The conductive material film 1054 may be formed by applying a conductive paste or a resinate solution (hereinafter referred to as a "conductive resinate solution") prepared by dissolving a resinate of a conductive material in a solvent and then by removing a dispersing medium or solvent, or may be formed by vapor deposition of a conductive material. The conductive paste is applied by screen printing or the like and the conductive resinate solution is applied by spin coating, spraying or the like. The conductive material is vapor-deposited by, for example, sputter vapor deposition or resistance heating vapor deposition. The contact angle of the conductive paste with the resist film pattern 1052 is preferably 50 degrees or more and more preferably 70 degrees or more to limit the end tail projection at the end of the conductive material film 1054.

Figure 14:
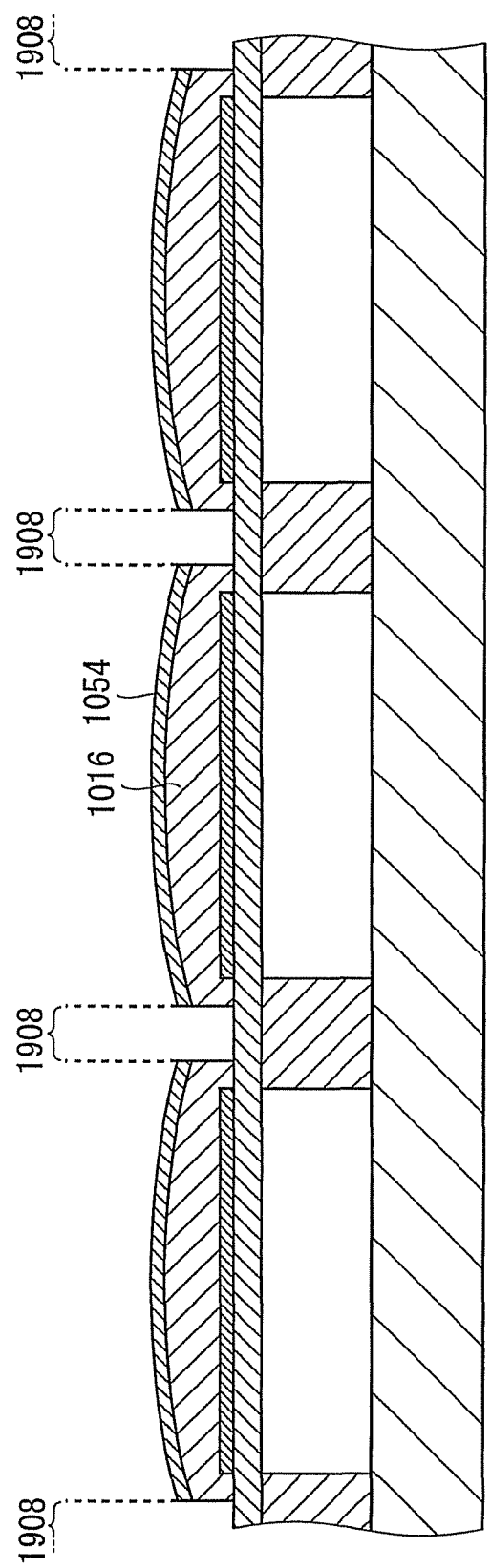

After the conductive material film 1054 is formed, as shown in FIG. 14, the resist film pattern 1052 left in the non-piezoelectric/electrostrictive region 1908 is removed. A conductive material film 1054 having the same plane shape as the piezoelectric/electrostrictive film 1016 on the same plane position as the piezoelectric/electrostrictive film 1016 is thereby formed. The resist film pattern 1052 is removed in the same manner as the resist film pattern 1042.

Figure 15:
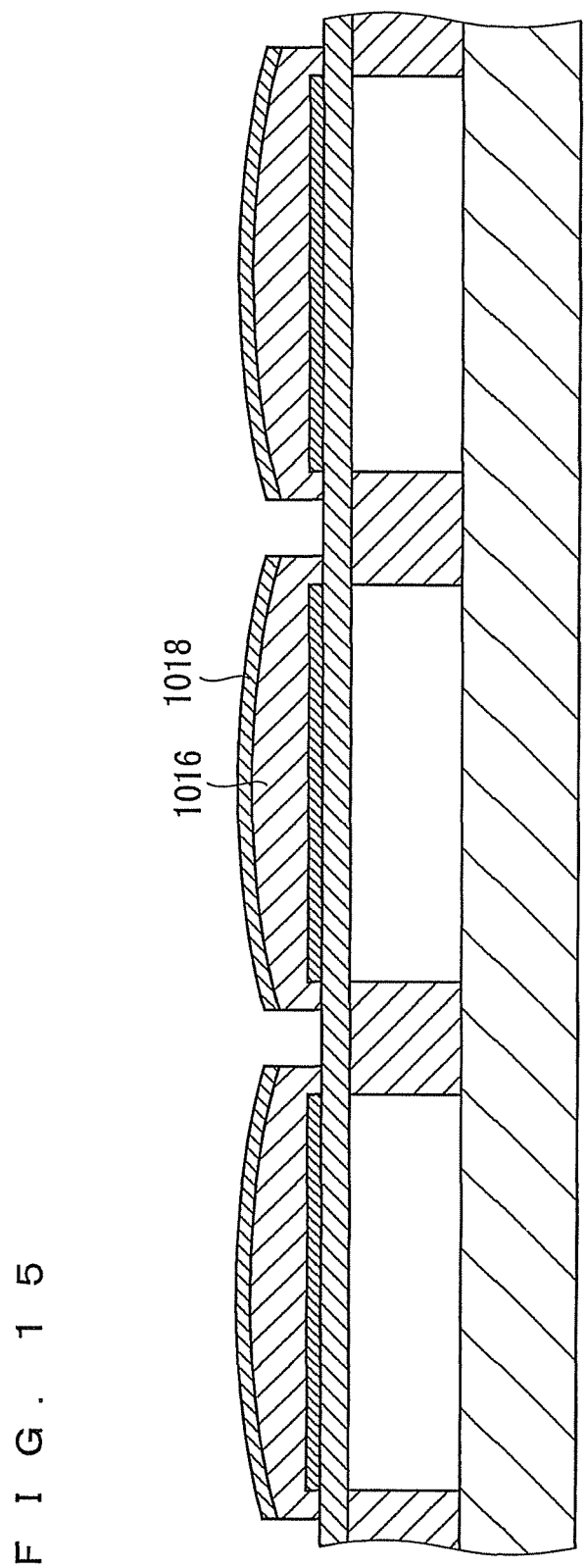

After the resist film pattern 1052 is removed, the conductive material film 1054 is fired. As shown in FIG. 15, the conductive material film 1054 is made into the upper electrode film 1018 and the upper electrode film 1018 having the same plane shape as the piezoelectric/electrostrictive film 1016 is thereby formed on the same plane position as the piezoelectric/electrostrictive film 1016. In this case, slight shrinkage caused by firing is allowed. The conductive material film 1054 is fired preferably at a firing temperature of 200° C. or more and 300° C. or less when the conductive material film 1054 is formed using a conductive paste in which nano-particles of platinum are dispersed in a dispersing medium, by screen printing and at a firing temperature of 1000° C. or more and 1350° C. or less when the conductive material film 1054 is formed using a conductive paste in which a platinum powder is dispersed in a dispersing medium, by screen printing. Also, when the conductive material film 1045 is formed using a conductive resinate solution prepared by dissolving a platinum resinate in a solvent, by spin coating, the firing temperature is preferably 600° C. or more and 800° C. or less. The upper electrode film 1018 may be formed by electroless plating in the same manner as the lower electrode film 1014.

{Formation of Upper Wire Electrode 1030}

An upper wire electrode 1030 is formed after the conductive material film 1054 is fired. The upper wire electrode 1030 is formed in the same manner as the lower wire electrode 1028. The upper wire electrode 1030 may be fired at the same time when the upper electrode film 1018 is fired.

According to the method of producing the piezoelectric/electrostrictive film type device 1002, the packing density of the lower electrode film 1014 is improved and also, the heat resistance of the lower electrode film 1014 is improved, so that the coating ratio of the lower electrode film 1014 is increased.

Further, since the lower electrode film 1014 is formed in the cavity region 1902, the deviation of the plane position of the lower electrode film 1014 from the plane position of the cavity 1024 is limited.

Moreover, since the piezoelectric/electrostrictive film 1016 is formed in the piezoelectric/electrostrictive region 1906 including the cavity region 1902 where the lower electrode film 1014 is formed, the deviation of the plane position of the piezoelectric/electrostrictive film 1016 from the plane position of the lower electrode film 1014 is limited.

In addition, since the upper electrode film 1018 is formed in the piezoelectric/electrostrictive region 1906, the deviation of the plane position of the upper electrode film 1018 from the plane position of the piezoelectric/electrostrictive film 1016 is limited.

The deviation of each plane position of the lower electrode film 1014, piezoelectric/electrostrictive film 1016 and upper electrode film 1018 which constitute the vibrating laminate 1004 from the plane position of the cavity 1024 is limited, with the result that the deviation of the plane position of the vibrating laminate 1004 from the plane position of the cavity 1024 is limited. This contributes to restriction on a variation in the amount of ink to be jetted from a piezoelectric/electrostrictive actuator including the piezoelectric/electrostrictive film type device 1002.

<1.3 Method of Forming Resist Film Pattern 1042>

FIGS. 16 to 21 are schematic views for describing the method of forming the resist film pattern 1042 according to the first preferred embodiment. FIGS. 16 to 21 are sectional views of a half-finished product of the piezoelectric/electrostrictive film type device 1002.

Figure 16:
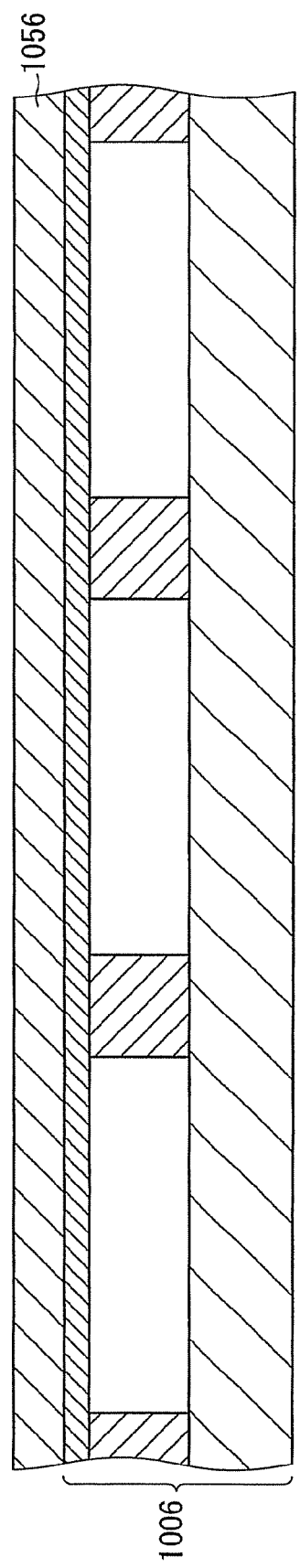
FIGS. 16 to 21 are views for describing a method of forming a resist pattern according to the first preferred embodiment.

In the formation of the resist film pattern 1042, as shown in FIG. 16, a resist film 1056 is formed on the surface of the substrate 1006. The resist film 1056 is formed by applying a resist solution prepared by dissolving a resist solid in a solvent or dispersing the resist solid in a dispersing medium, to the surface of the substrate 1006 by a spin coater and by heating the half-finished product by a hot plate, oven or the like to vaporize the solvent from the coating film. Of course, the resist solution may be applied by other methods such as spraying. As the resist, a negative type photoresist is used which is deteriorated in solubility in a developing solution when it is exposed to light. Therefore, the resist film 1056 is a photosensitive film which is deteriorated in solubility in a developing solution when exposed to light. As the resist, it is preferable to use a thick-film responsive resist suitable to form a thick film and it is more preferable to use a high-aspect responsive resist having the characteristics that even if a pattern having a high aspect ratio is formed, the section of the pattern scarcely has a tapered form.

When the resist film pattern 1042 is exposed to a strong alkali reducing agent solution and plating solution in electroless plating which will be described later, an appropriate material for the resist is selected from photosensitive materials, such as a polyimide and fluororesin resistant to strong alkalis.

Figure 17:
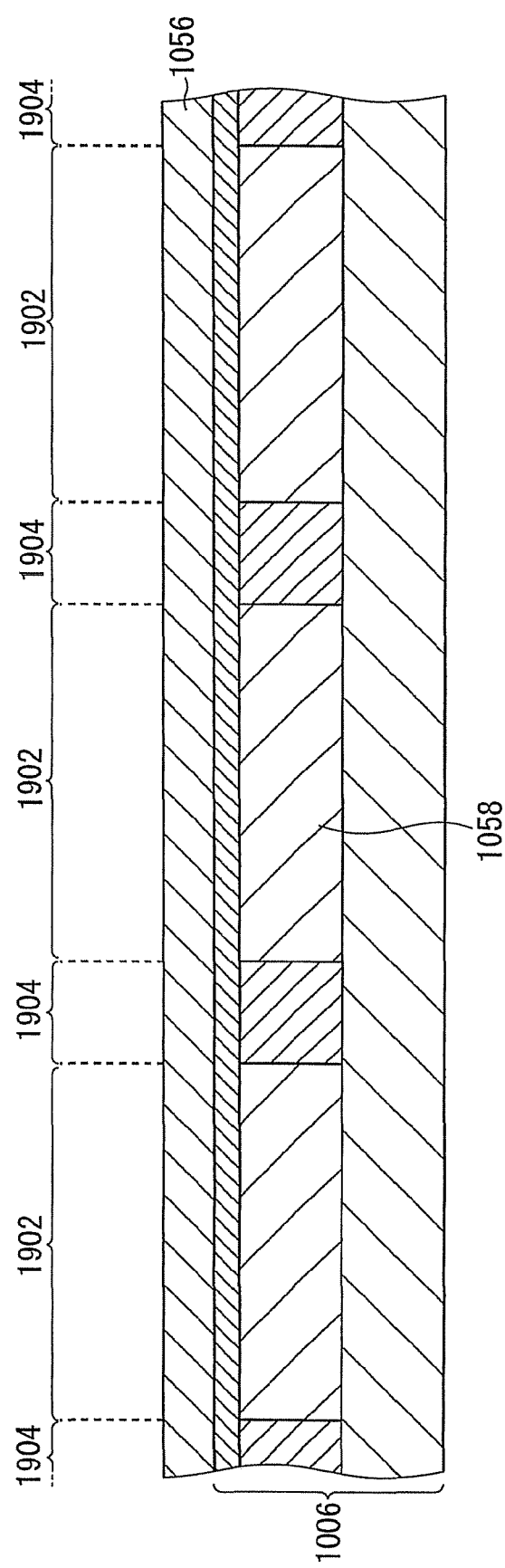

After the resist film 1056 is formed, the cavity 1024 is filled with a light-shielding agent 1058 to impart, to the substrate 1006, a function as a mask which shields the cavity region 1902 but does not shield the non-cavity region 1904 as shown in FIG. 17. The filling of the light-shielding agent 1058 in the cavity 1024 is accomplished only by carrying out this treatment before the substrate is irradiated with light from the backside which will be described later. Therefore, the resist film 1056 may be formed on the substrate 1006 after the light-shielding agent 1058 is filled in the cavity 1024. The filling of the light-shielding agent 1058 in the cavity 1024 is accomplished by injecting a light-shielding solution prepared by dissolving a solid of the light-shielding agent 1058 in a solvent or by dispersing the solid of the light-shielding agent 1058 in a dispersing medium, into the ink jetting hole 1020 or ink supply hole 1022 by an injector and by heating the half-finished product by, for example, a hot plate or oven to dry the light-shielding solution. The following method may be adopted instead of the injection using an injector. Specifically, a porous material such as a sintered metal impregnated with the light-shielding solution is brought into contact with the backside of the substrate 1006 to allow the light-shielding solution to flow into the cavity 1024 from the porous material by the capillary phenomenon. Additionally, after the light-shielding solution is injected, vacuum defoaming may be carried out. The light-shielding agent 1058 preferably contains dyes or pigments which absorb light for exposure and more preferably contains pigments. This is because the resolution of patterning is improved when the light-shielding agent 1058 contains pigments. The optical concentration of the light-shielding agent 1058 is preferably 2 to 3 on OD value basis. Alternatively, a light-shielding agent 1058 differing in refractive index from the substrate 1006 may be used to thereby cause the total internal reflection of the light for exposure in the cavity region 1902.

Figure 18:
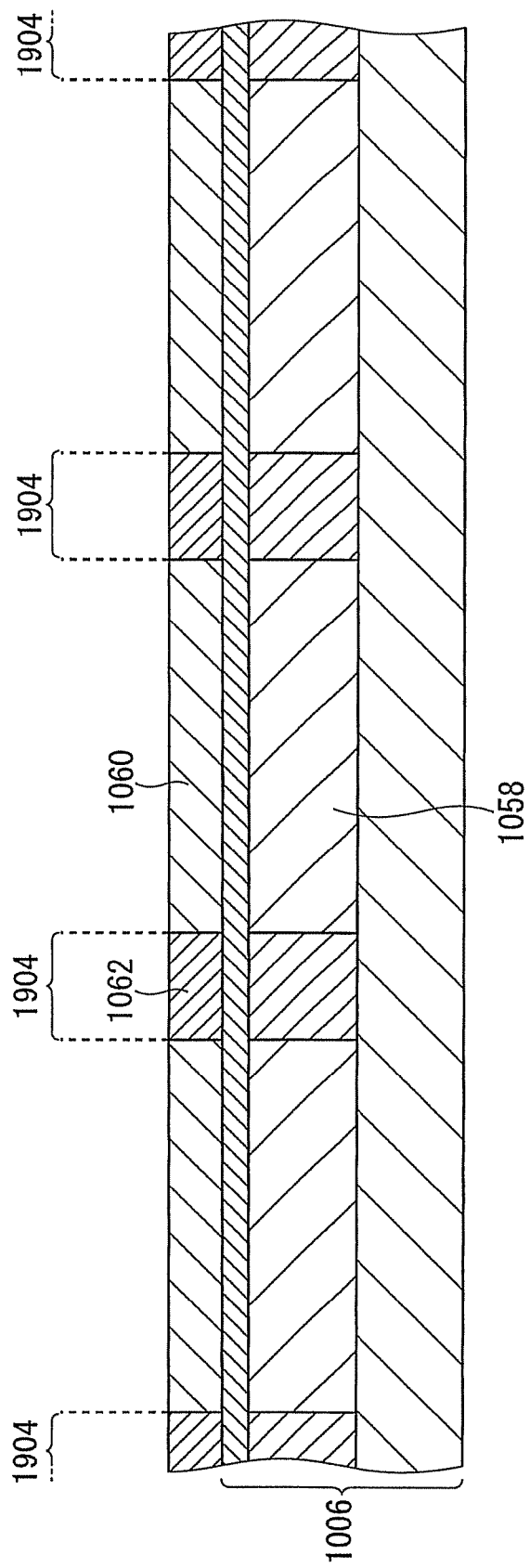

After the resist film 1056 is formed and the cavity 1024 is filled with the light-shielding agent 1058, the substrate 1006 is irradiated with light from the backside of the substrate 1006 to selectively expose the resist film 1056 formed in the non-cavity region 1904, thereby forming an unexposed part 1060 and an exposed part 1062 as shown in FIG. 18. A latent image obtained by reverse transfer of the plane shape of the cavity 1024 is thus described on the resist film 1056.

Figure 19:
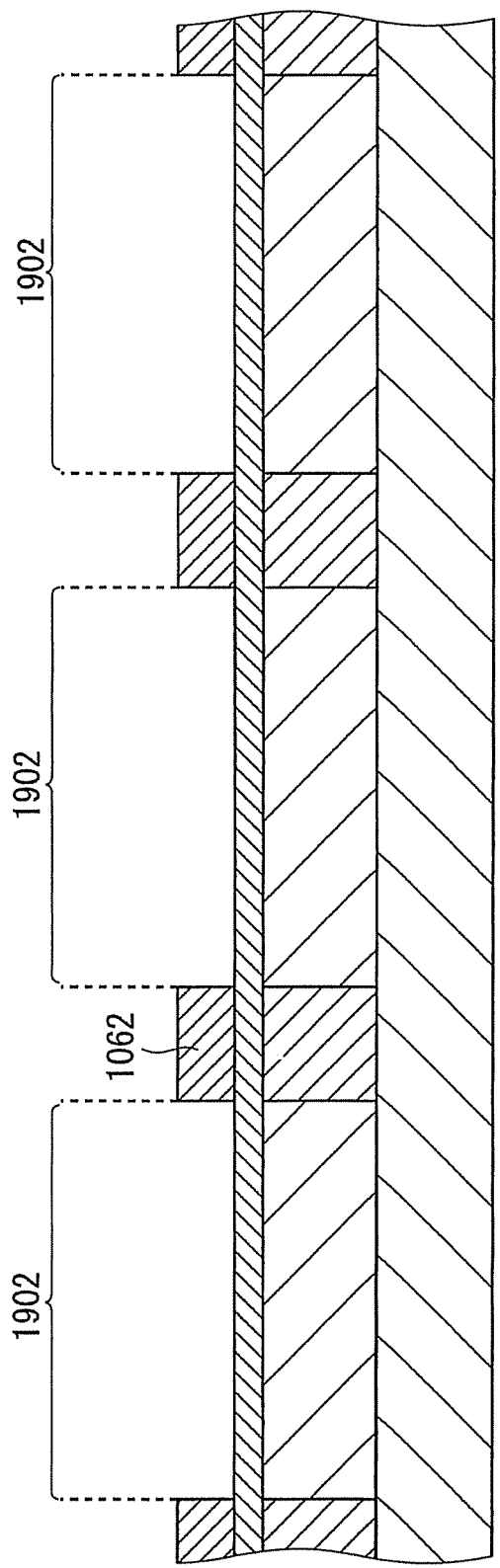

After the latent image is described, the unexposed part 1060 of the resist film 1056 which is formed in the cavity region 1902 is removed by developing as shown in FIG. 19. The latent image is developed by dipping the half-finished product in a developing solution with fluctuation to remove the unexposed part 1060, followed by washing the half-finished product with pure water or the like. As the developing solution, a solution which selectively dissolves the unexposed part 1060 but does not dissolve the exposed part 1062 is selected.

Figure 20:
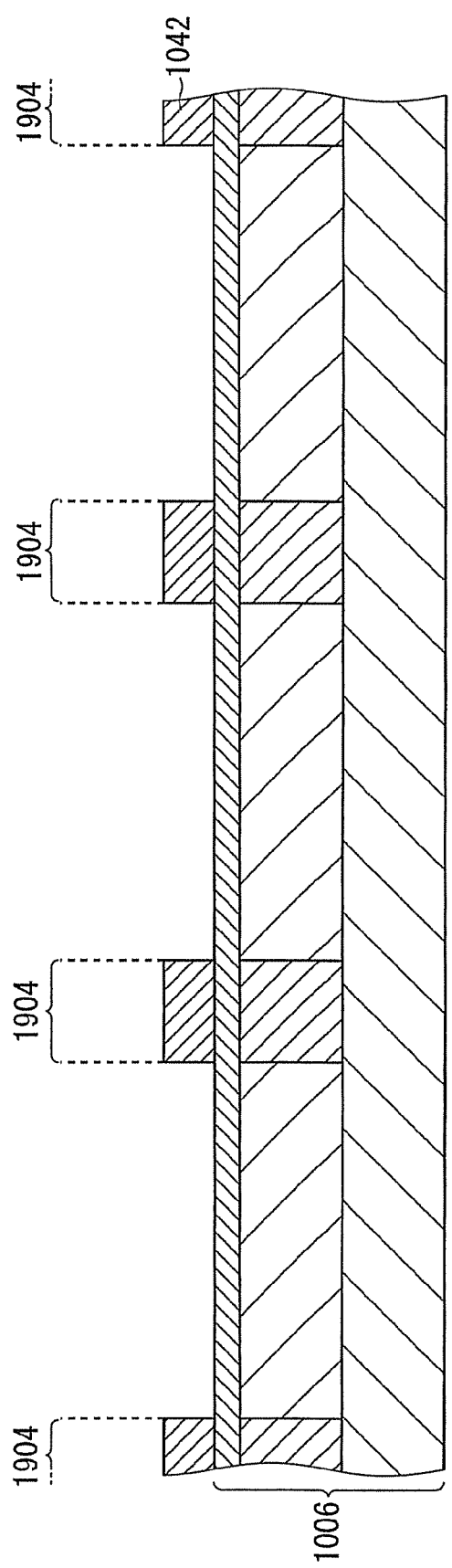

After the latent image is developed, the substrate 1006 is irradiated with light from the backside of the substrate 1006 to further expose the exposed part 1062 left in the non-cavity region 1904 to cure the exposed part 1062 to a solid. The resist film pattern 1042 is thereby completed as shown in FIG. 20.

Figure 21:
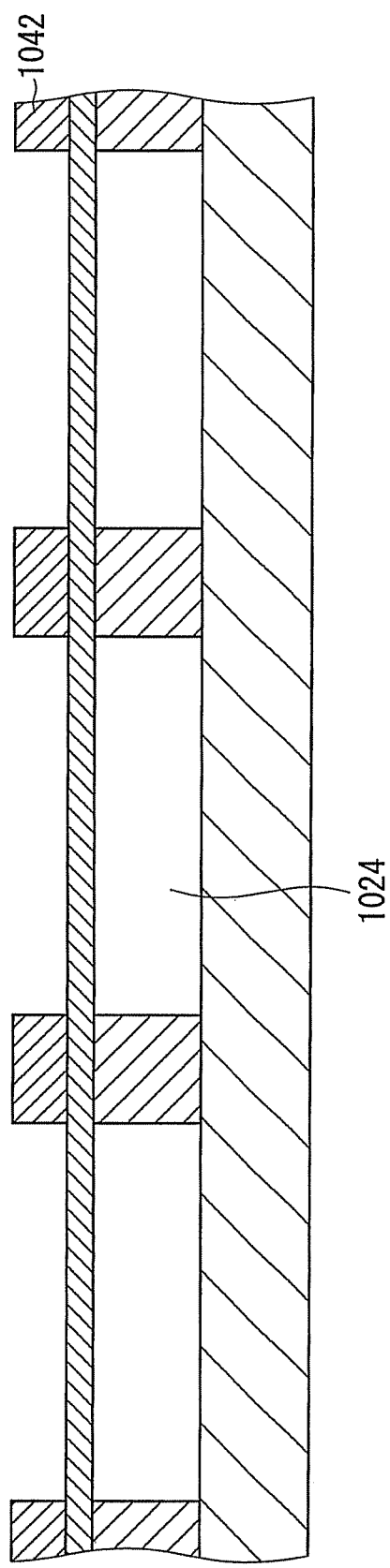

After the resist film pattern 1042 is completed, the light-shielding agent 1058 is removed from the cavity 1024 as shown in FIG. 21. The removal of the light-shielding agent 1058 from the cavity 1024 is accomplished only by carrying out this operation after the aforementioned irradiation with light from the backside. Therefore, the unexposed part 1060 may be removed after the light-shielding agent 1058 is removed from the cavity 1024. The removal of the light-shielding agent 1058 from the cavity 1024 is carried out by dipping the half-finished product in a solvent.

<1.4 Method of Forming Resist Film Pattern 1052>

FIGS. 22 to 25 are schematic views for describing a method of forming the resist film pattern 1052 according to the first preferred embodiment. FIGS. 22 to 25 are sectional views of a half-finished product of the piezoelectric/electrostrictive film type device 1002.

Figure 22:
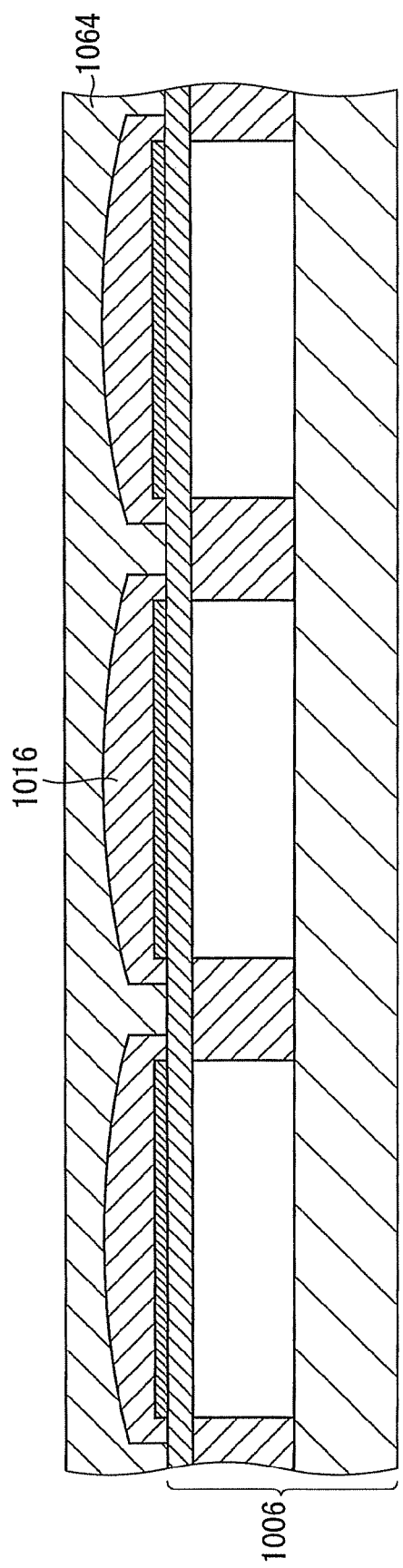
FIGS. 22 to 25 are views for describing a method of forming a resist pattern according to the first preferred embodiment.

In the formation of the resist film pattern 1052, a resist film 1064 is formed on the surface of the substrate 1006 in such a manner that it is overlapped on the piezoelectric/electrostrictive film 1016 as shown in FIG. 22. The resist film 1064 is formed in the same manner as the resist film 1056 and in the formation of the resist film 1064, the same resist as that used for forming the resist film 1056 is used.

Figure 23:
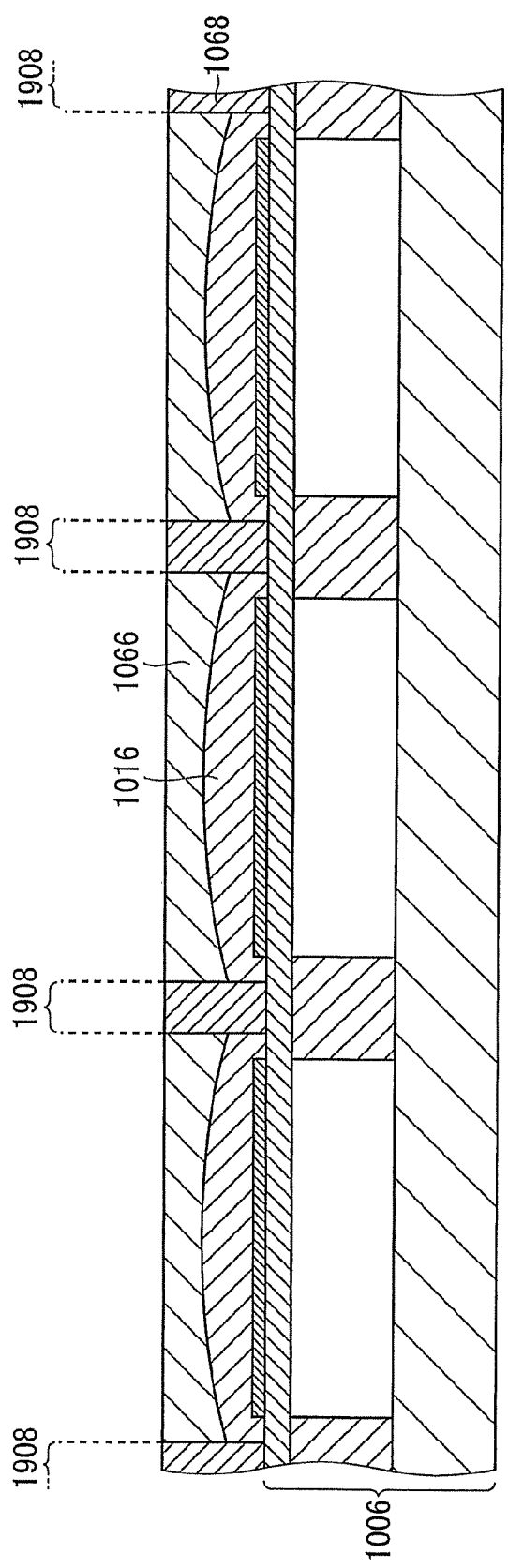

After the resist film 1064 is formed, the substrate 1006 is irradiated h light from the backside of the substrate 1006 to selectively expose the resist film 1064 formed in the non-piezoelectric/electrostrictive region 1908, thereby forming an unexposed part 1066 and an exposed part 1068 as shown in FIG. 23. A latent image obtained by reverse transfer of the plane shape of the piezoelectric/electrostrictive film 1016 is thus described on the resist film 1064.

Figure 24:
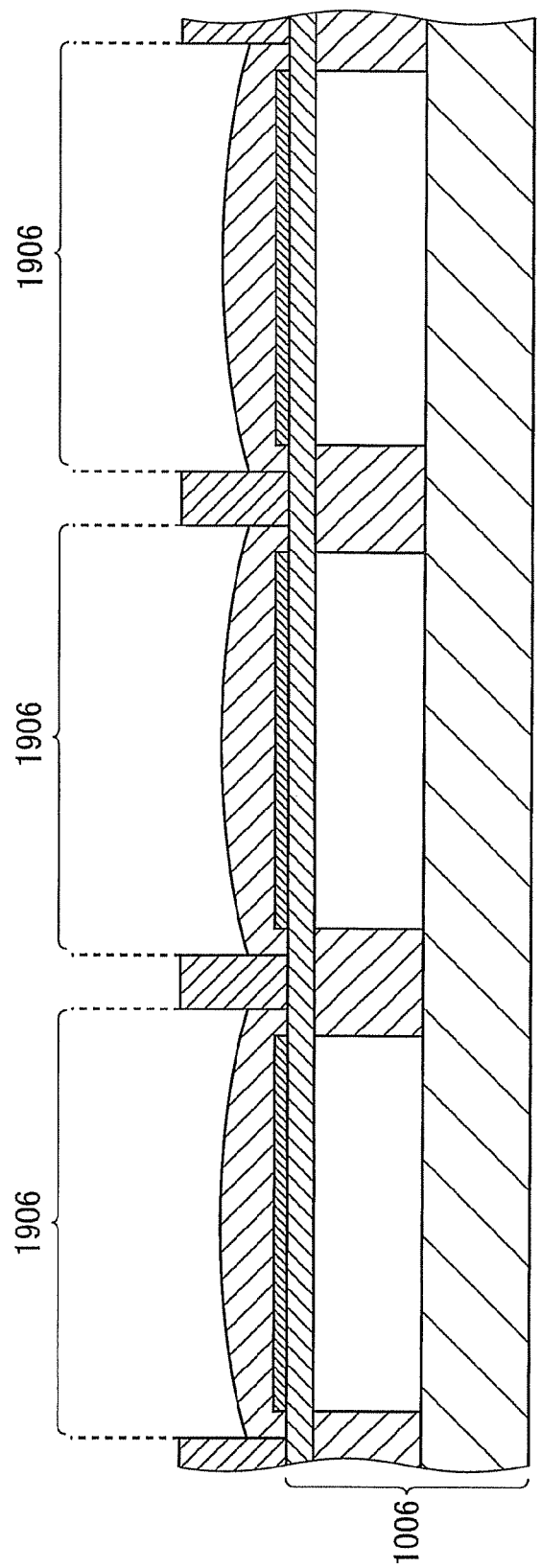

After the latent image is described, the unexposed part 1066 of the resist film 1064 formed in the piezoelectric/electrostrictive region 1906 is removed by developing as shown in FIG. 24. The latent image is developed in the same manner as the latent image formed on the resist film 1056 and in the developing of the latent image, the same developing solution as that used in the case of developing the latent image described on the resist film 1056 is used.

Figure 25:
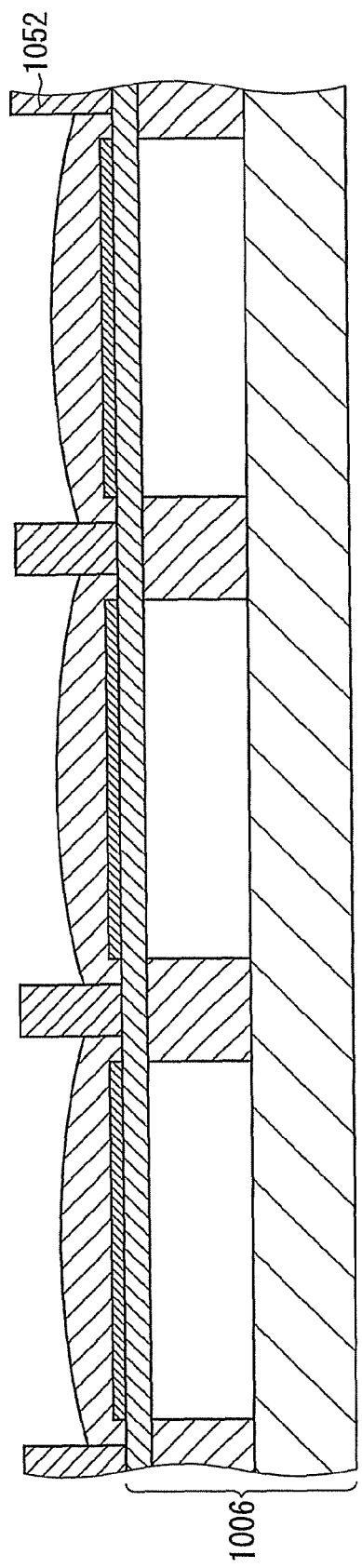

After the latent image is developed, the substrate 1006 is irradiated with light from the front side of the substrate 1006 to further expose the exposed part 1068 left in the non-piezoelectric/electrostrictive region 1908, thereby curing the exposed part 1068 to a solid. The resist film pattern 1052 is thus completed as shown in FIG. 25.

2 Second Preferred Embodiment

A second preferred embodiment relates to a method of forming a lower electrode film 2014 which is adopted in place of the method of forming the lower electrode film 1014 according to the first preferred embodiment. In the method of forming the lower electrode film 2014 according to the second preferred embodiment, for example, a half-finished product is dipped in a catalyst metal solution to form a catalyst layer 2046.

FIGS. 26 to 31 are views for describing the method of forming the lower electrode film 2014 according to the second preferred embodiment. FIGS. 26 to 31 are sectional views of a half-finished product of the piezoelectric/electrostrictive film type device 1002.

Figure 26:
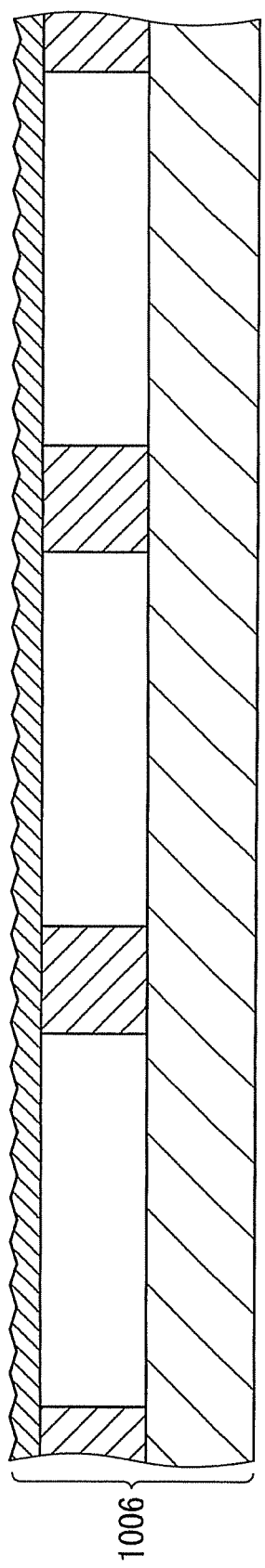
FIGS. 26 to 31 are views for describing a method of forming a lower electrode film according to a second preferred embodiment.

As shown in FIG. 26, the surface of the substrate 1006 is roughened as pretreatment in the method of forming the lower electrode film 2014 according to the second preferred embodiment. Since the surface on which the lower electrode film 2014 is formed is roughened, the adhesion of the lower electrode film 2014 is improved.

The surface of the substrate 1006 may be roughened either by chemical action such as wet etching or dry etching using a fluorine compound or by physical action such as dry blasting, wet blasting or vacuum blasting.

Figure 31:
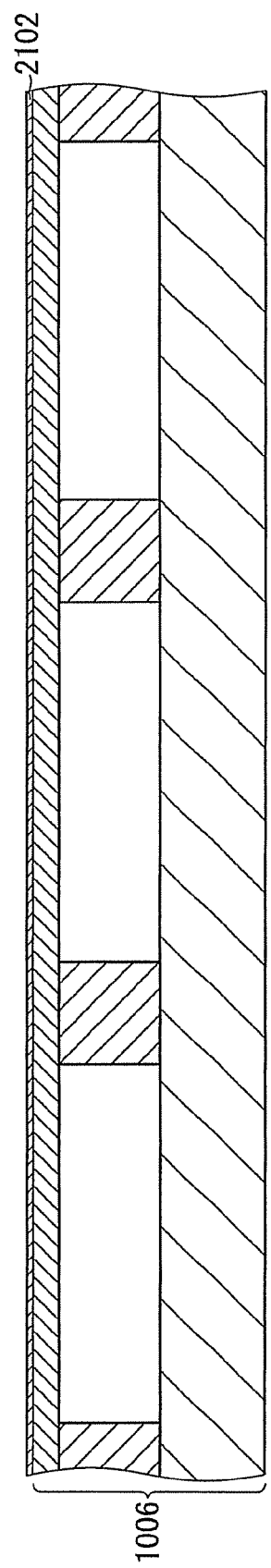

As shown in FIG. 31, pretreatment in which an adhesive layer 2102 which improves the adhesion of the lower electrode film 2014 is formed on the surface of the substrate 1006 may be carried out instead of the pretreatment in which the surface of the substrate 1006 is roughened. The adhesive layer 2102 is typically formed on the surface of the substrate 1006 by forming a thin film of a metal such as titanium or chromium by vapor deposition such as sputter vapor deposition or resistance heating vapor deposition, though it is a layer more highly adhesive to the lower electrode film 2014 than the surface of the substrate 1006.

Figure 27:
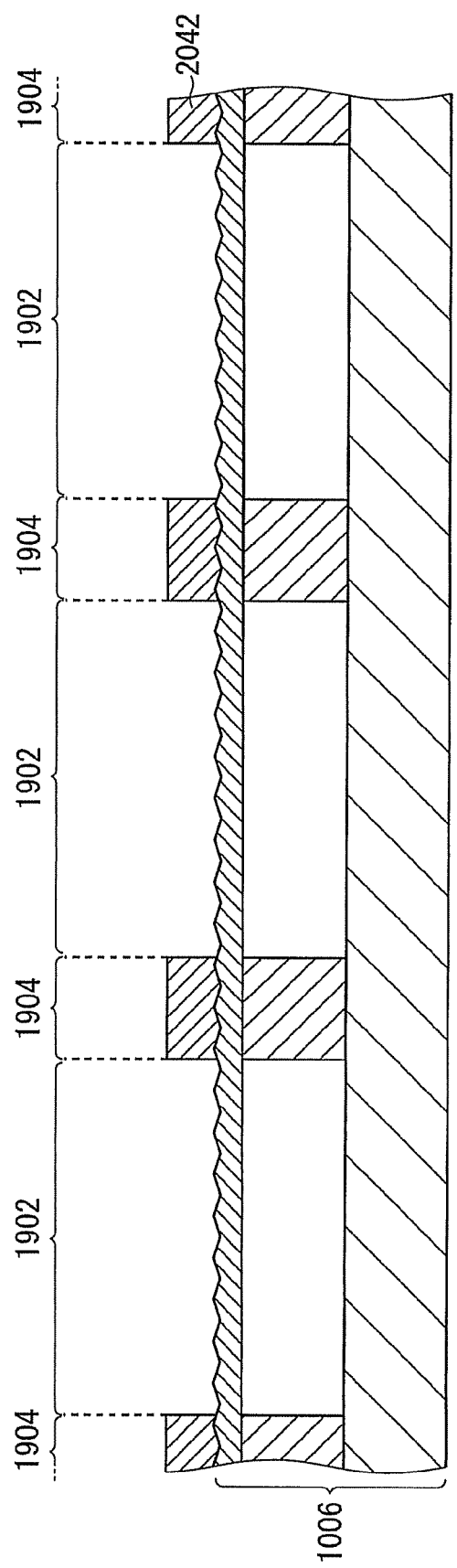

After the surface of the substrate 1006 is pretreated, a resist film pattern 2042 which does not cover the cavity region 1902 but covers the non-cavity region 1904 is formed on the surface of the substrate 1006 as shown in FIG. 27. The resist film pattern 2042 is formed in the same manner as the resist film pattern 1042 described in the first preferred embodiment.

Figure 28:
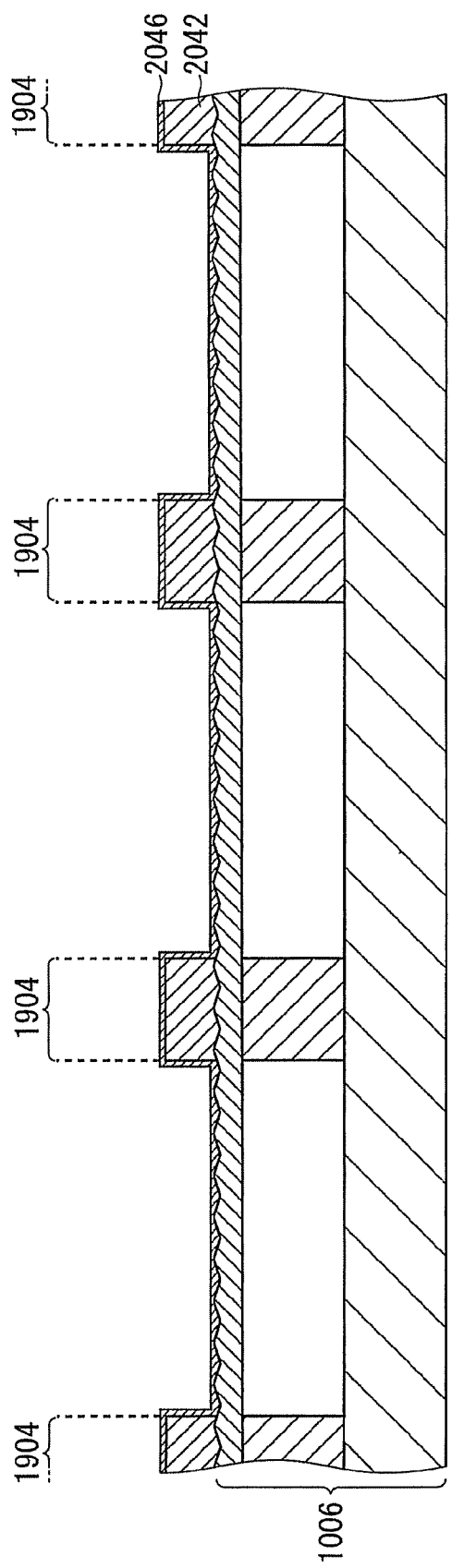

After the resist film pattern 2042 is formed, a catalyst layer 2046 is formed on the surface of the substrate 1006 in such a manner that it is overlapped on the resist film pattern 2042 as shown in FIG. 28. In this case, there is no problem even if the catalyst layer 2046 overflows into the non-cavity region 1904 because the resist film pattern 2042 is removed afterward. Also, even if the formation of the catalyst layer 2046 in the non-cavity region 1904 is imperfect, there is no problem.

The catalyst layer 2046 is formed, for example, by dipping the half-finished product in a catalyst metal solution prepared by dissolving a catalyst metal in a solvent to bring the catalyst metal solution into contact with the surface of the substrate 1006 in which the resist film pattern 2042 is left in the non-cavity region 1904 and by drying to remove the solvent stuck to the surface of the substrate 1006. A catalyst metal dispersion solution obtained by dispersing catalyst metal microparticles in a dispersing medium may be used instead of the catalyst metal solution and may be brought into contact with the surface of the substrate 1006, followed by drying to remove the dispersing medium stuck to the surface of the substrate 1006. When the catalyst metal is platinum, for example, an aqueous chloro-platinic acid solution is used as the catalyst metal solution and for example, a platinum nano-colloid dispersion solution is used as the catalyst metal dispersion solution. Here, a metal microparticle dispersion paste may be used in place of the platinum nano-colloid dispersion solution.

Examples of the metal microparticle dispersion paste include metal nano-pastes which can be fired at normal temperature.

The catalyst layer 2046 is formed also by vapor-depositing the catalyst metal on the surface of the substrate 1006 in which the resist film pattern 2042 is left in the non-cavity region 1904 by, for example, sputter vapor deposition or resistance heating vapor deposition. In this case, the film thickness of the catalyst layer 2046 is preferably 0.01 to 0.1 μm.

Figure 29:
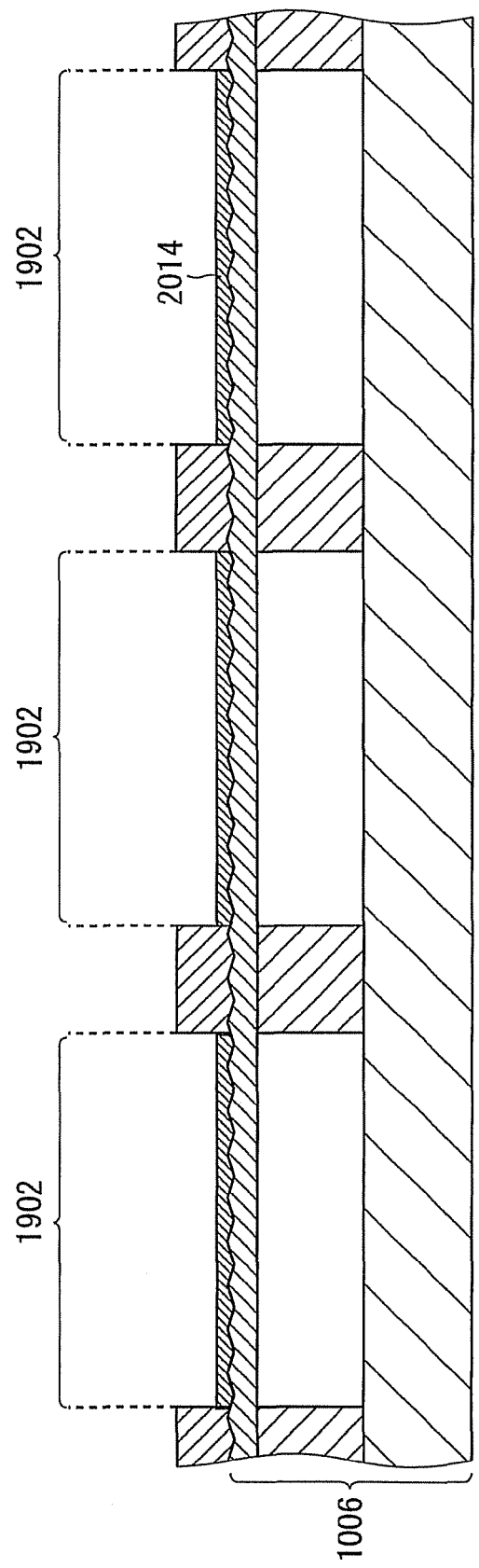

After the catalyst layer 2046 is formed, a plating film is formed on the catalyst layer 2046 by electroless plating. As shown in FIG. 29, the lower electrode film 2014 is thereby formed in the cavity region 1902 as shown in FIG. 29.

Figure 30:
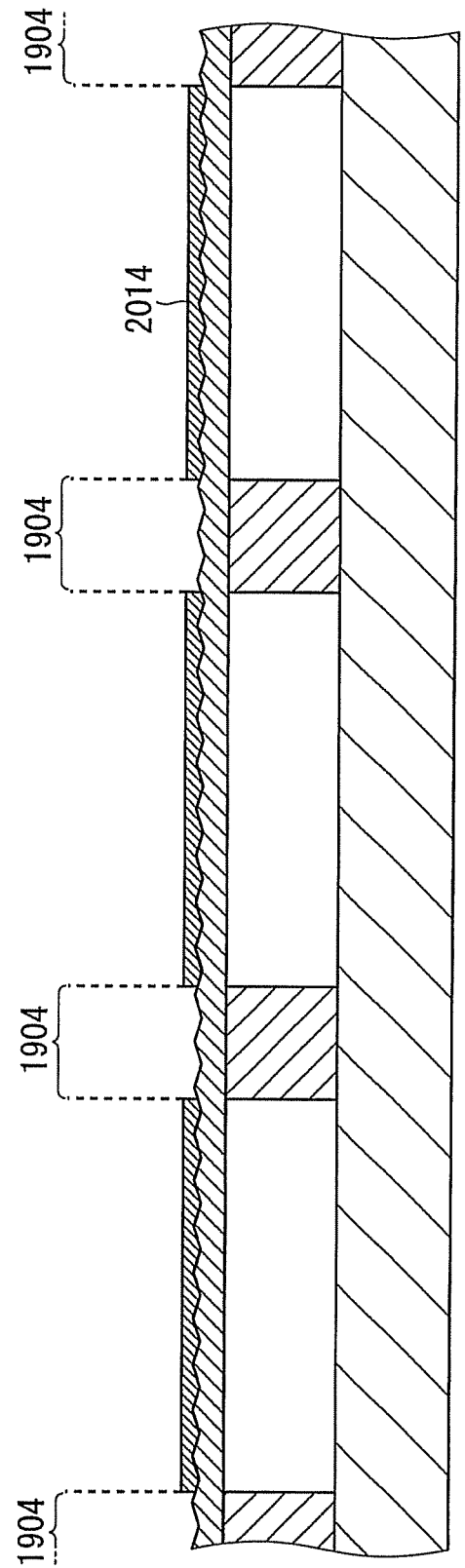

After the lower electrode film 2014 is formed, the resist film pattern 2042 left in the non-cavity region 1904 is peeled and removed as shown in FIG. 30. The resist film pattern 2042 is peeled in the same manner as the resist film pattern 1042 described in the first preferred embodiment.

According to the method of forming the lower electrode film 2014 of the second preferred embodiment, the pack density of the lower electrode film 2014 is improved and also, the heat resistance is improved, and therefore, the coating ratio of the lower electrode film 2014 is increased. Moreover, since the lower electrode film 2014 is formed in the cavity region 1902, the deviation of the plane position of the lower electrode film 2014 from the plane position of the cavity 1024 is limited. This ensures that the lower electrode film 2014 to be adopted instead of the lower electrode film 1014 adopted in the first preferred embodiment is provided.

3 Third Preferred Embodiment

A third preferred embodiment relates to a method of forming a piezoelectric/electrostrictive film 3016 which is to be adopted instead of the method of forming the piezoelectric/electrostrictive film 1016 described in the first preferred embodiment. In the method of forming the piezoelectric/electrostrictive film 3016 according to the third preferred embodiment, the piezoelectric/electrostrictive film 3016 is formed using the lower electrode film 1014 as a mask by photolithography.

<3.1 Method of Forming the Piezoelectric/Electrostrictive Film 3016>

FIGS. 32 to 35 are schematic views for describing the method of forming the piezoelectric/electrostrictive film 3016 according to the third preferred embodiment. FIGS. 32 to 35 are sectional views of a half-finished product of the piezoelectric/electrostrictive film type device 1002.

Figure 32:
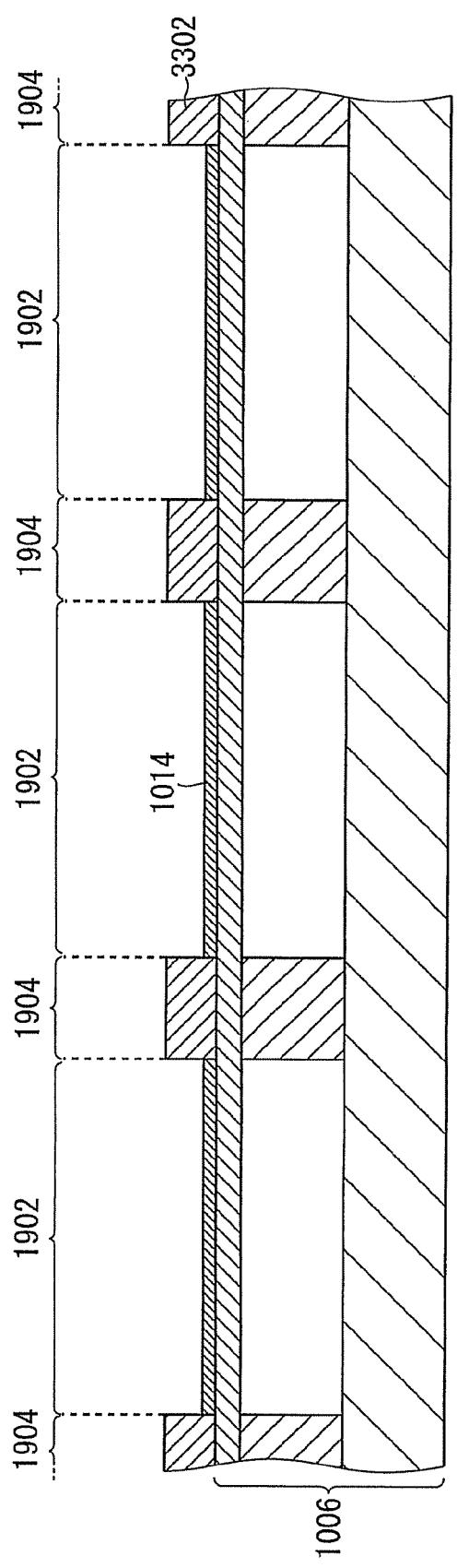
FIGS. 32 to 35 are views for describing a method of forming a piezoelectric/electrostrictive film according to a third preferred embodiment.

In the formation of the piezoelectric/electrostrictive film 3016, a resist film pattern 3302 which does not cover the cavity region 1902 but covers the non-cavity region 1904 is formed on the surface of the substrate 1006 as shown in FIG. 32. The resist film pattern 3302 is formed by patterning the resist film which covers the surface of the substrate 1006 by using the lower electrode film 1014 as a mask.

Figure 33:
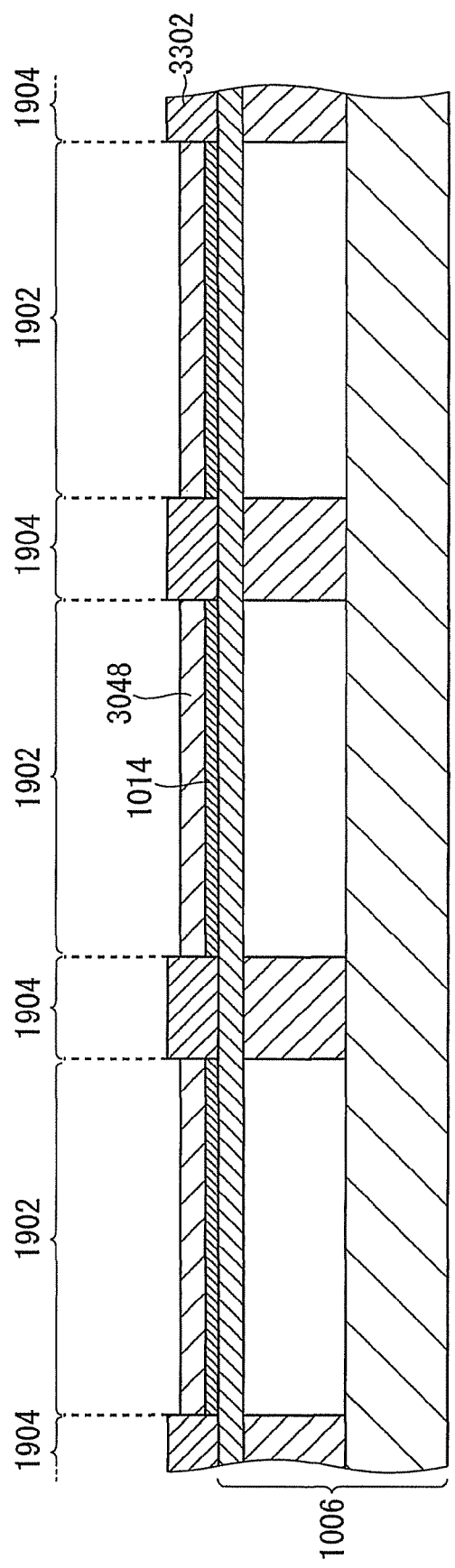

After the resist film pattern 3302 is formed, a piezoelectric/electrostrictive material film 3048 which is to be a piezoelectric/electrostrictive film 3016 is overlapped and formed on the lower electrode film 1014 in the cavity region 1902 where the resist film pattern 3302 is not formed on the surface of the substrate 1006 as shown in FIG. 33. In this case, even if the piezoelectric/electrostrictive material film 3048 overflows into the non-cavity region 1904, there is no problem because the resist film pattern 3302 is removed afterward. The piezoelectric/electrostrictive material film 3048 is formed by applying a paste (hereinafter referred to as a "piezoelectric/electrostrictive paste") obtained by dispersing a piezoelectric/electrostrictive material in a dispersing medium, followed by removing the dispersing medium. The piezoelectric/electrostrictive paste is applied by screen printing or the like. In order to limit the end tail projection at the end of the piezoelectric/electrostrictive film 3016, the contact angle of the piezoelectric/electrostrictive paste with the resist film pattern 3302 is preferably 50 degrees or more and more preferably 70 degrees or more.

Figure 34:
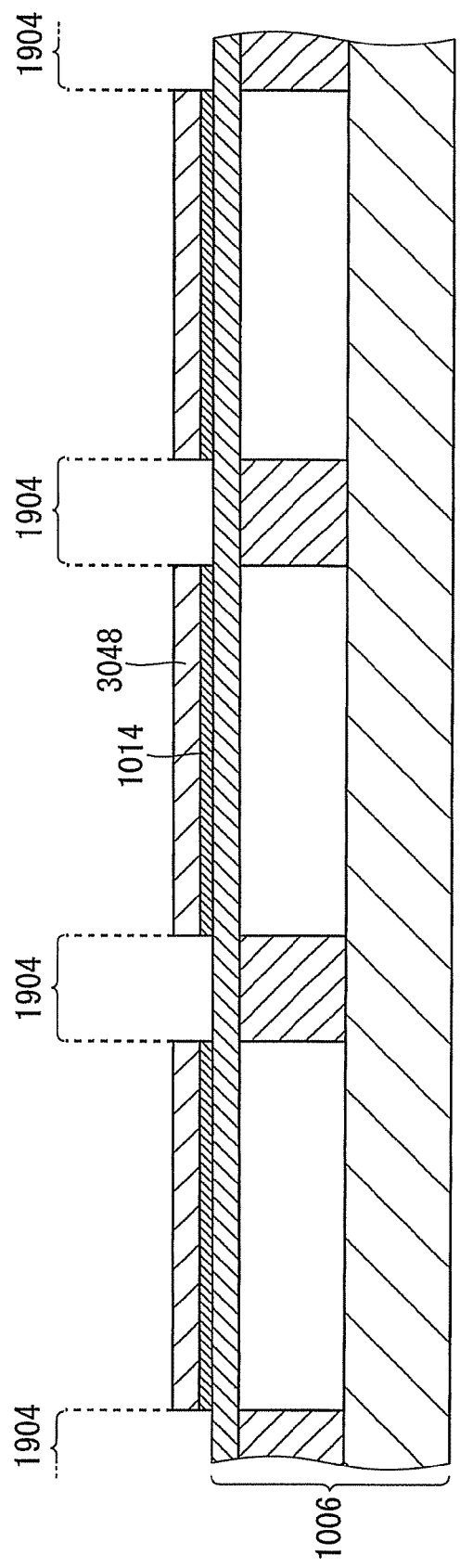

After the piezoelectric/electrostrictive material film 3048 is formed, the resist film pattern 3302 left in the non-cavity region 1904 where the lower electrode film 1014 is not formed is removed as shown in FIG. 34. This results in the formation of the piezoelectric/electrostrictive material film 3048 having the same plane shape as the lower electrode film 1014 on the same plane position as the lower electrode film 1014. The resist film pattern 3302 is peeled in the same manner as the resist film pattern 1042 used in the first preferred embodiment.

Figure 35:
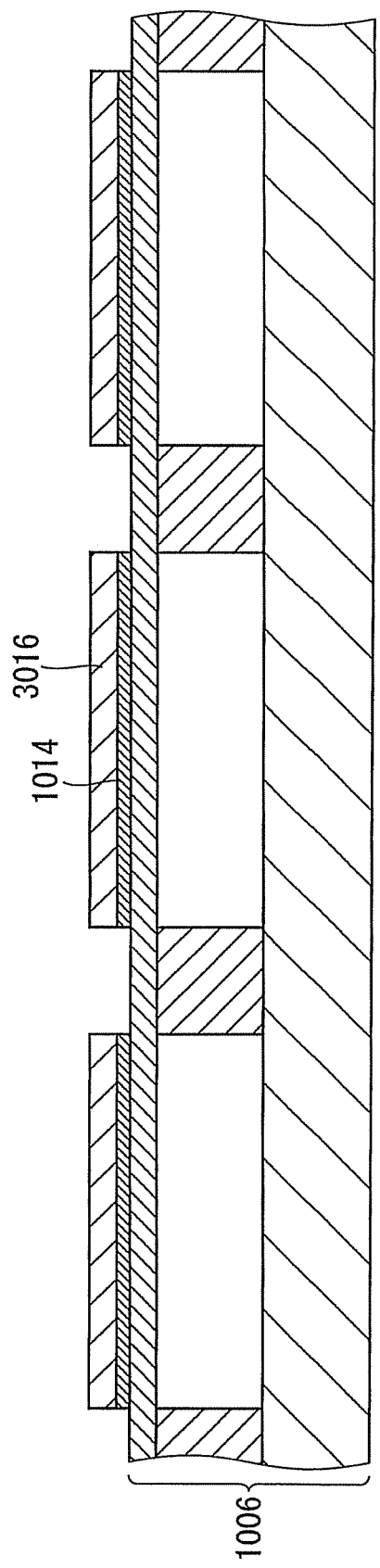

After the resist film pattern 3302 is peeled off, the piezoelectric/electrostrictive material film 3048 is fired. As shown in FIG. 35, the piezoelectric/electrostrictive material film 3048 thereby becomes the piezoelectric/electrostrictive film 3016 and the piezoelectric/electrostrictive film 3016 having the same plane shape as the lower electrode film 1014 is formed on the same plane position as the lower electrode film 1014. In this case, slight shrinkage caused by firing is allowed. The piezoelectric/electrostrictive material film 3048 is fired in the same manner as the piezoelectric/electrostrictive material film 1048 described in the first preferred embodiment.

According to the method of forming the piezoelectric/electrostrictive film 3016 of the third preferred embodiment, the piezoelectric/electrostrictive film 3016 is formed in the cavity region 1902 where the lower electrode film 1014 is formed and therefore, the deviation of the plane position of the piezoelectric/electrostrictive film 3016 from the plane position of the lower electrode film 1014 is limited. This allows the production of the piezoelectric/electrostrictive film 3016 to be adopted in place of the piezoelectric/electrostrictive film 1016 described in the first preferred embodiment.

<3.2 Method of Forming Resist Film Pattern 3302>

FIGS. 36 to 39 are schematic views for describing a method of forming a resist film pattern 3302 according to the third preferred embodiment. FIGS. 36 to 39 are sectional views of a half-finished product of a piezoelectric/electrostrictive film type device.

Figure 36:
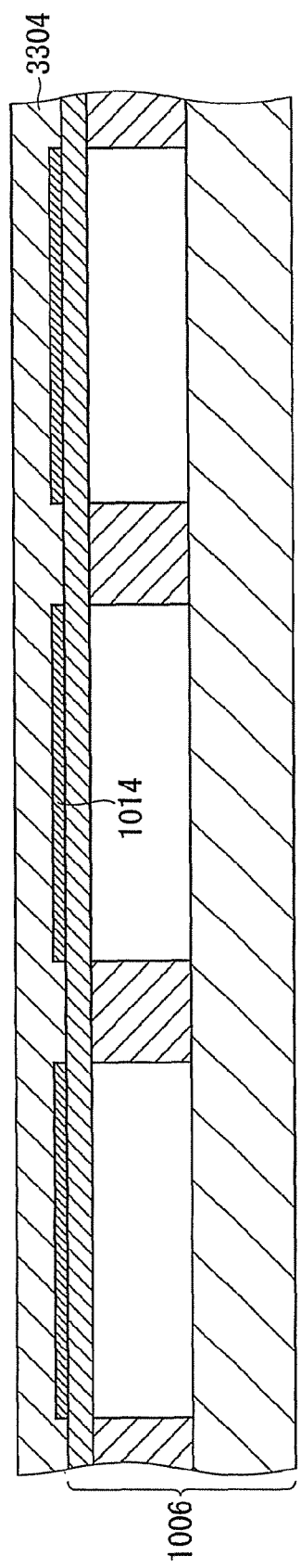
FIGS. 36 to 39 are views for describing a method of forming a resist pattern according to the third preferred embodiment.

In the formation of the resist film pattern 3302, a resist film 3304 is formed on the surface of the substrate 1006 such that it is overlapped on the lower electrode film 1014 as shown in FIG. 36. The resist film 3304 is formed in the same manner as the resist film 1056 of the first preferred embodiment. In the formation of the resist film 3304, the same resist that is used to form the resist film 1056 of the first preferred embodiment is used.

Figure 37:
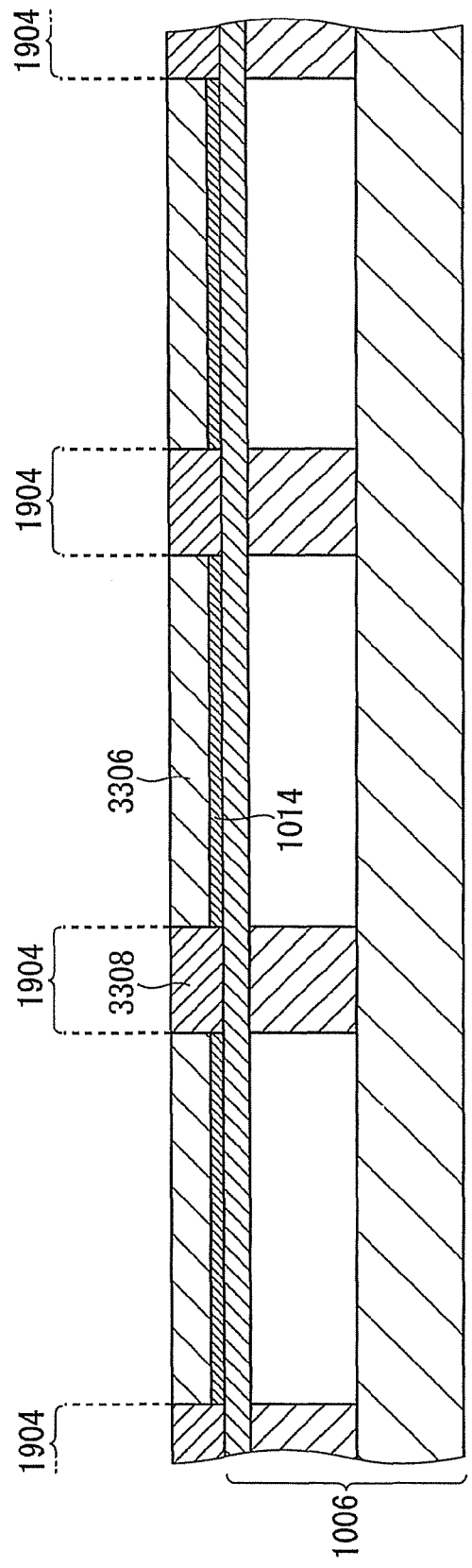

After the resist film 3304 is formed, the substrate 1006 is irradiated with light from the backside of the substrate 1006 to selectively expose the resist film 3304 formed in the non-cavity region 1904 where the lower electrode film 1014 is not formed to form an unexposed part 3306 and an exposed part 3308 as shown in FIG. 37. A latent image obtained by reverse transfer of the plane shape of the lower electrode film 1014 is thus described on the resist film 3304.

Figure 38:
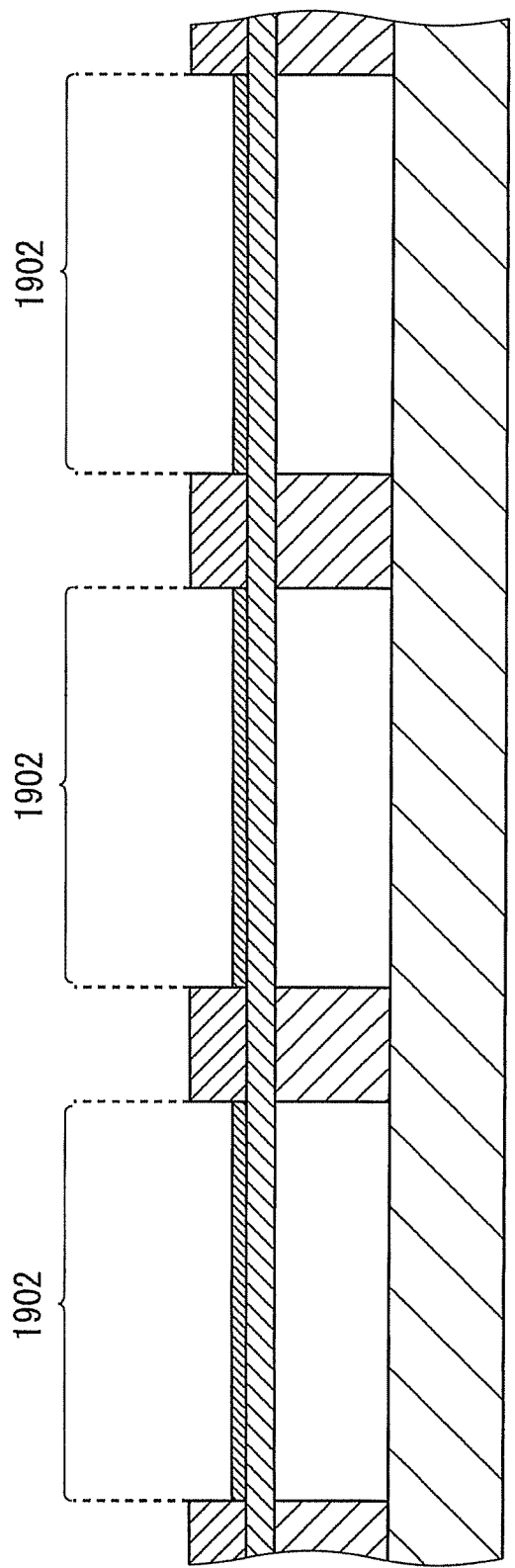

After the latent image is described, the unexposed part 3306 of the resist film 3304 formed in the cavity region 1902 is removed by developing as shown in FIG. 38. The latent image is developed in the same manner as the latent image described on the resist film 1056 and, specifically, the latent image is developed using the same developing solution as that used to develop the latent image described on the resist film 1056.

Figure 39:
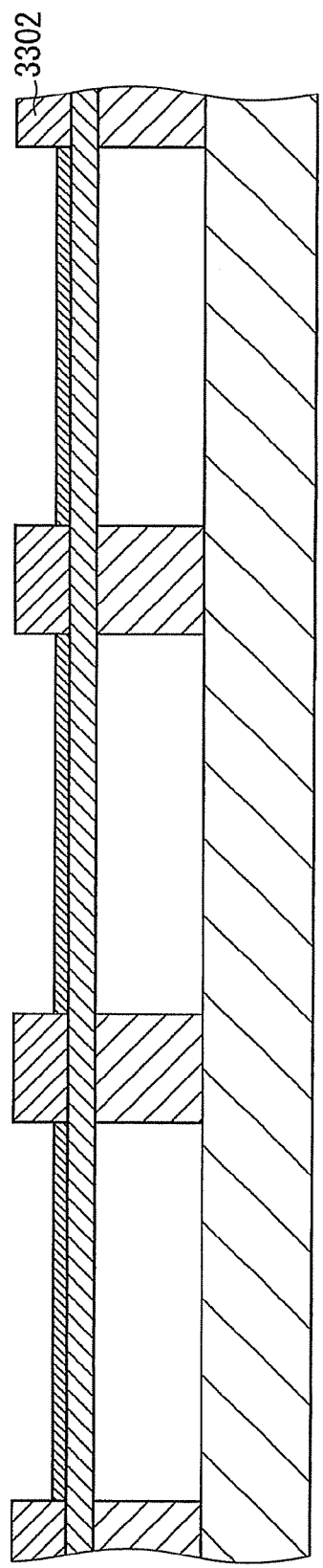

After the latent image is developed, the substrate 1006 is irradiated with light from the surface side of the substrate 1006 to further expose the exposed part 3308 left in the non-cavity region 1904, thereby curing the exposed part 3308 to a solid. The resist film pattern 3302 is thus completed as shown in FIG. 39.

4 Fourth Preferred Embodiment

A fourth preferred embodiment relates to a method of forming a resist film pattern 4042 to be adopted instead of the method of forming the resist film pattern 1042 according to the first preferred embodiment.

<4.1 Method of Forming Resist Film Pattern 4042>

FIGS. 40 to 45 are schematic views for describing a method of forming a resist film pattern 4042 according to the fourth preferred embodiment. FIGS. 40 to 45 are sectional views of a half-finished product of the piezoelectric/electrostrictive film type device 1002. In the method of forming the resist film pattern 4042 according to the fourth preferred embodiment, a positive type photoresist is used.

Figure 40:
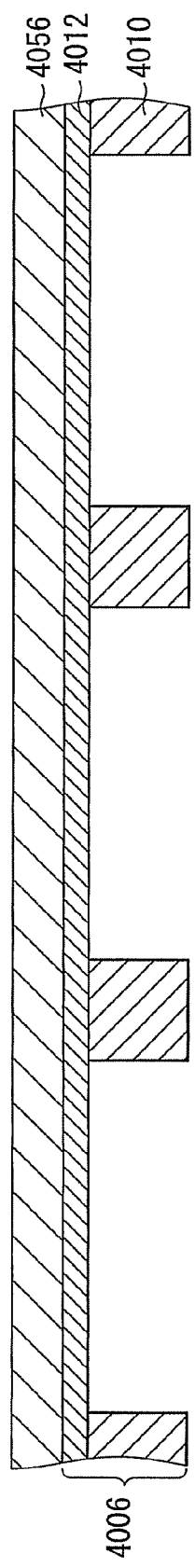
FIGS. 40 to 45 are views for describing a method of forming a resist pattern according to a fourth preferred embodiment.

In the formation of the resist film pattern 4042, a resist film 4056 is formed on a substrate 4006 prepared by laminating a base plate 4010 and a vibrating plate 4012 in this order from bottom to top as shown in FIG. 40. The plate thickness of the vibrating plate 4012 is also preferably 30 μm or less. The resist film 4056 is formed in the same manner as the resist film 1056. As the resist, a positive type photoresist is used which is increased in solubility in a developing solution when it is exposed to light. Therefore, the resist film 4056 is a photosensitive film which is increased in solubility in a developing solution when it is exposed to light. As the resist, it is preferable to use a thick-film responsive resist suitable to form a thick film and it is more preferable to use a high-aspect responsive resist having the characteristics that even if a pattern having a high aspect ratio is formed, the section of the pattern scarcely has a tapered form.

When the resist film pattern 4042 is exposed to a strong alkali reducing agent solution and plating solution in electroless plating, an appropriate material for the resist is selected from composite materials of photosensitive materials and photo-insensitive materials, such as a polyimide and fluororesin resistant to strong alkalis.

Figure 41:
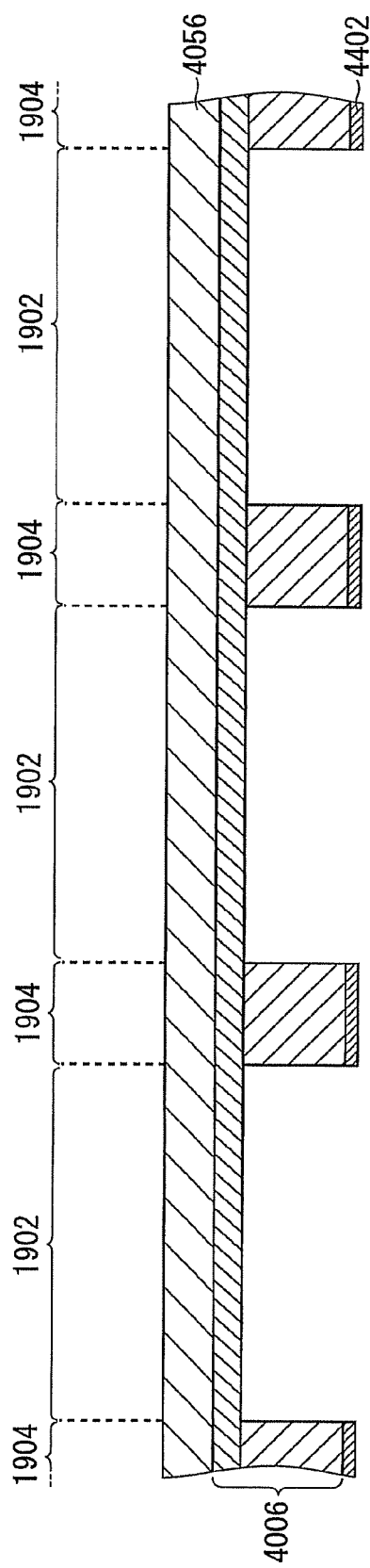

After the resist film 4056 is formed, a light-shielding film 4402 is formed in the non-cavity region 1904 on the backside of the substrate 4006 to impart, to the substrate 4006, a function as a mask which shields the non-cavity region 1904 but does not shield the cavity region 1902 as shown in FIG. 41. The formation of the light-shielding film 4402 is accomplished only by carrying out this treatment before the substrate is irradiated with light from the backside which will be described later. Therefore, the resist film 4056 may be formed on the surface of the substrate 4006 after the light-shielding film 4402 is formed. The light-shielding film 4402 is formed by applying a light-shielding solution obtained either by dissolving a solid of the light-shielding film 4402 in a solvent or by dispersing that solid in a dispersing medium, to the surface of the substrate 1006 by a spin coater and by heating the half-finished product by a hot plate, oven or the like to vaporize the solvent or dispersing medium from the coating film. Of course, the light-shielding solution may be applied by other methods such as spraying. In these cases, it is preferable to mask the inside of the cavity 1024 with a material such as a liquid or organic resin, which can be removed afterward, to prevent the light-shielding film 4402 from penetrating into the cavity 1024. Alternatively, offset printing/roller transfer which is a transfer system, or impregnation printing may be adopted as the method of forming the light-shielding film 4402.

The light-shielding film 4402 preferably contains dyes or pigments which absorb light for exposure and more preferably contains pigments. This is because the resolution of patterning is improved when the light-shielding film 4402 contains pigments. The formation of such a light-shielding film 4402 has the advantage that the resolution of patterning is improved because a difference in light transmittance between the cavity region 1902 and the non-cavity region 1904 is increased. However, if a sufficient difference in light transmittance is obtained even if the light-shielding film 4402 is not formed, the process of forming the light-shielding film 4402 may be omitted.

Figure 42:
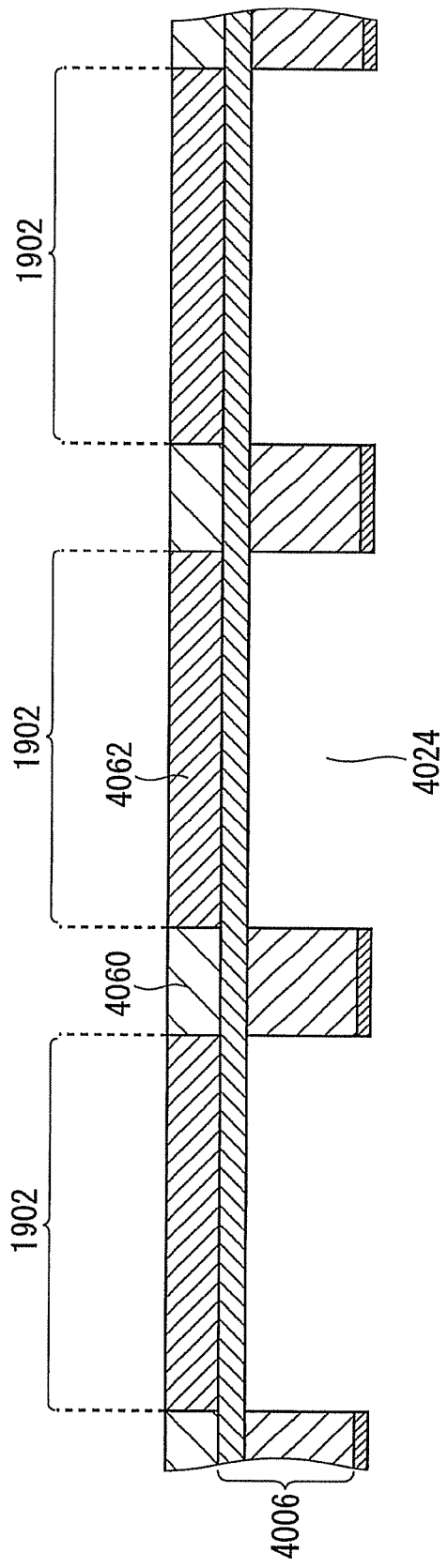

After the resist film 4056 is formed and the light-shielding film 4402 is formed, the substrate 4006 is irradiated with light from the backside of the substrate 4006 to selectively expose the resist film 4056 formed in the cavity region 1902, thereby forming an unexposed part 4060 and an exposed part 4062 as shown in FIG. 42. A latent image obtained by reverse transfer of the plane shape of the cavity 4024 is thus described on the resist film 4056.

Figure 43:
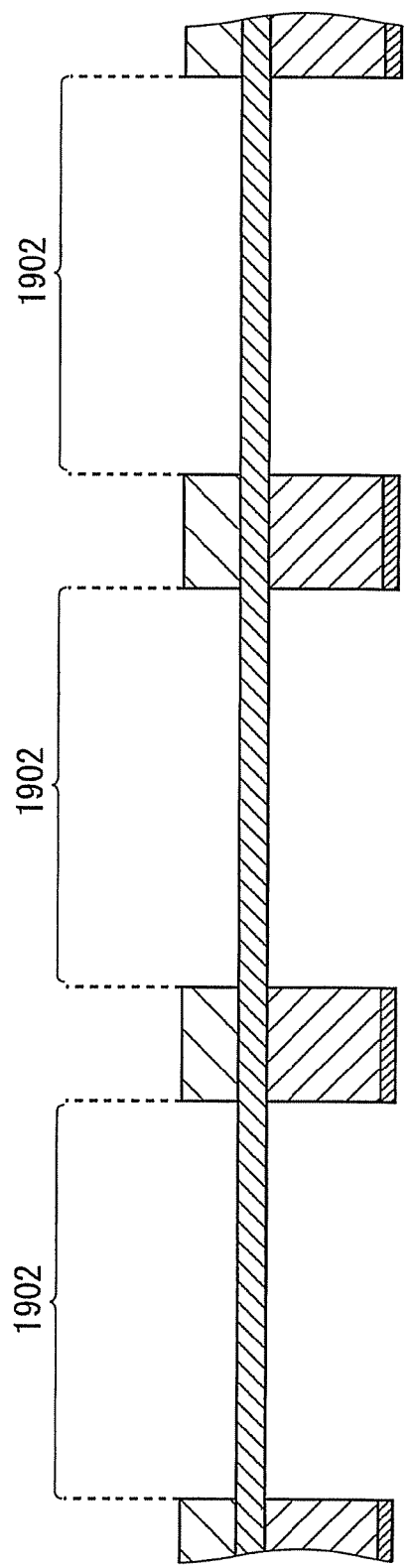

After the latent image is described, the exposed part 4062 of the resist film 4056 which is formed in the cavity region 1902 is removed by developing as shown in FIG. 43. The latent image is developed by dipping the half-finished product in a developing solution with fluctuation to remove the exposed part 4062, followed by washing the half-finished product with pure water or the like. In the developing of the latent image, a developing solution which selectively dissolves the exposed part 4062 but does not dissolve the unexposed part 4060 is selected.

Figure 44:
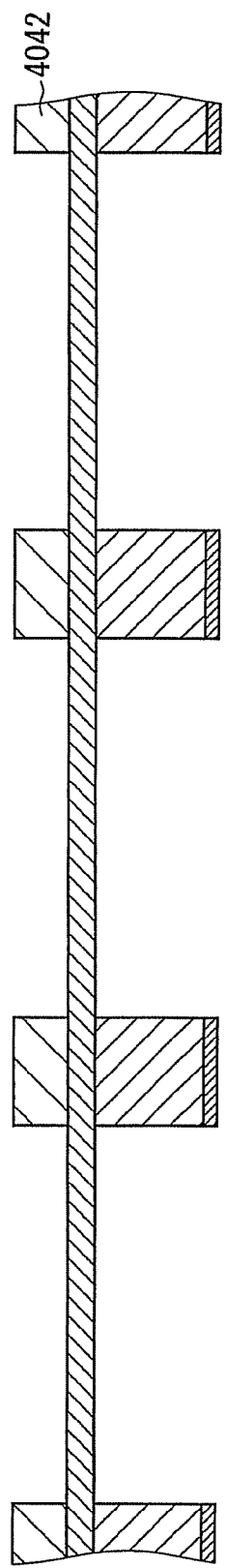

After the latent image is developed, the substrate 4006 is irradiated with light from the surface side of the substrate 4006 to expose the unexposed part 4060 left in the non-cavity region 1904 to cure the unexposed part 4060 to a solid. The resist film pattern 4042 is thereby completed as shown in FIG. 44.

Figure 45:
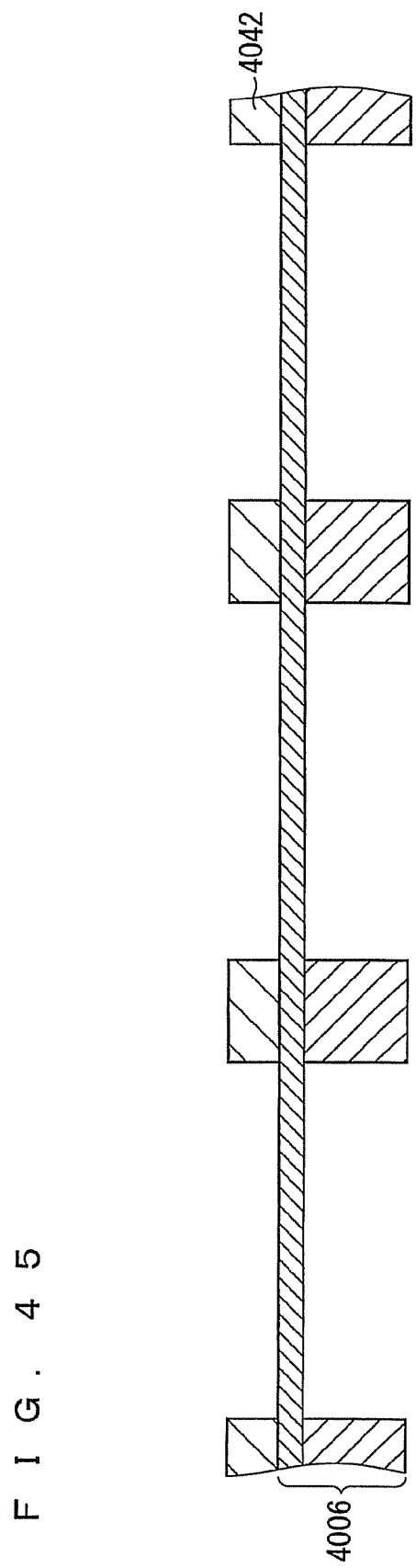

After the resist film pattern 4042 is completed, the light-shielding film 4402 is removed as shown in FIG. 45. The removal of the light-shielding film 4402 is accomplished only by carrying out this operation after the aforementioned irradiation with light from the backside. Therefore, the exposed part 4062 of the resist film 4056 may be removed after the light-shielding film 4402 is removed. The light-shielding film 4402 is removed by the chemical solution method. The light-shielding film 4402 may be removed by, for example, the heat treating method or plasma treating method.

The resist film pattern 4042 formed in this manner has the same function as the resist film pattern 1042 of the first preferred embodiment. In order to limit the end tail projection at the end of the conductive material film 1045 similarly to the case of the first preferred embodiment, the contact angle of the conductive material with the resist film pattern 4042 is preferably 50 degrees or more and more preferably 70 degrees or more.

Fifth Preferred Embodiment

A fifth preferred embodiment relates to treatment (hereinafter referred to as "projection limiting treatment") for limiting the end tail projection at the end of the lower electrode film 1014 which treatment is preferably carried out after the resist film pattern 1042 according to the first preferred embodiment is formed (FIG. 4) and before the catalyst pattern 1044 is formed (FIG. 5). This projection limiting treatment is preferably carried out also in the case of adopting the resist film pattern 4042 of the fourth preferred embodiment instead of the resist film pattern 1042 of the first preferred embodiment. The projection limiting treatment according to the fifth preferred embodiment is preferably adopted in the case where the contact angle of the conductive material with the resist film pattern 1042 or 4042 cannot be increased in the first or fourth preferred embodiment.

FIGS. 46 to 49 are views for describing the projection limiting treatment in the fifth preferred embodiment. FIGS. 46 to 49 are sectional views of a half-finished product of the piezoelectric/electrostrictive film type device 1002.

Figure 46:
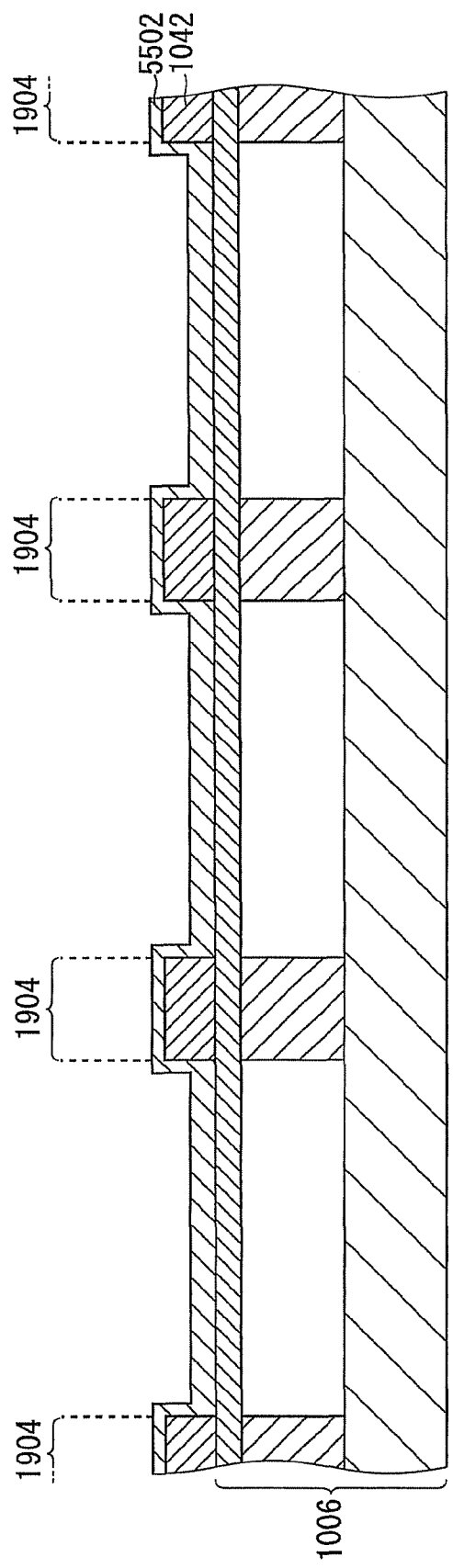
FIGS. 46 to 49 are views for describing a treatment for limiting an end tail projection according to a fifth preferred embodiment.

In the projection limiting treatment in the fifth preferred embodiment, a masking film 5502 is formed on the surface of the substrate 1006 such that it is overlapped on the resist film pattern 1042 left in the non-cavity region 1904 as shown in FIG. 46. The masking film 5502 is formed by applying a resin solution containing a resin such as an epoxy resin and polyimide resin, to the surface of the substrate 1006 by a spin coater and by heating the coating film by a hot plate, oven or the like or by irradiating the coating film with ultraviolet rays from a ultraviolet lamp to cure the coating film. Of course, the resin solution may be applied by other methods such as spraying.

Figure 47:
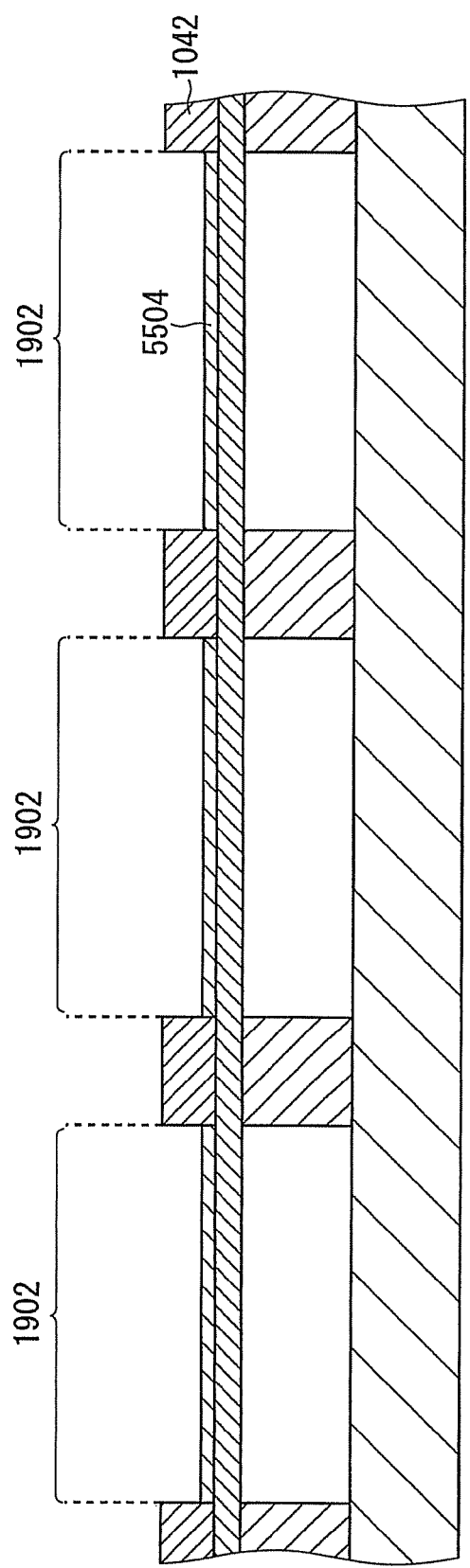

After the masking film 5502 is formed, the masking film 5502 is removed until the resist film pattern 1042 is exposed. The masking film 5502 is removed, for example, by dipping the half-finished product in a solvent to dissolve the masking film 5502. This ensures that a masking film pattern 5504 left in the cavity region 1902 is formed as shown in FIG. 47.

Figure 48:
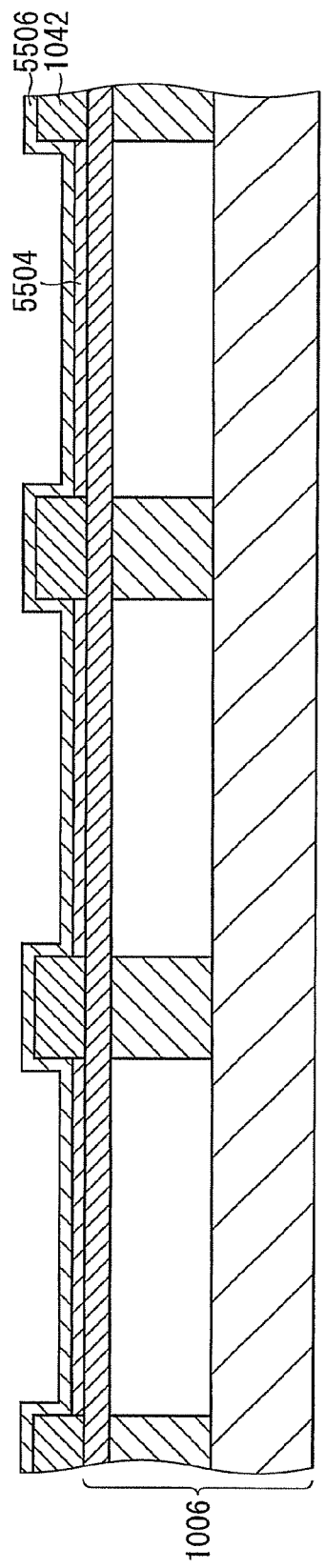

After the resist film pattern 1042 is exposed, a water-repellent film 5506 is formed on the surface of the substrate 1006 such that it is overlapped on the resist film pattern 1042 and masking film pattern 5504 as shown in FIG. 48. The water-repellent film 5506 needs to have higher water-repellency to the conductive material than at least that of the resist film pattern 1042. Specifically, the contact angle with the conductive material is preferably 50 degrees or more and more preferably 70 degrees or more. The water-repellent film 5506 is formed by applying a water-repellent agent obtained by dissolving a water-repellent material such as a silicone resin or fluororesin in a solvent or by dispersing the water-repellent material in a dispersing medium, to the surface of the substrate 1006 by a spin coater and by heating the half-finished product by a hot plate, oven or the like to vaporize the solvent from the coating film, thereby curing the water-repellent material. Of course, the water-repellent material may be applied by other methods such as spraying. Further, when a cold-curing type water repellent material is used, the heating may be omitted.

Figure 49:
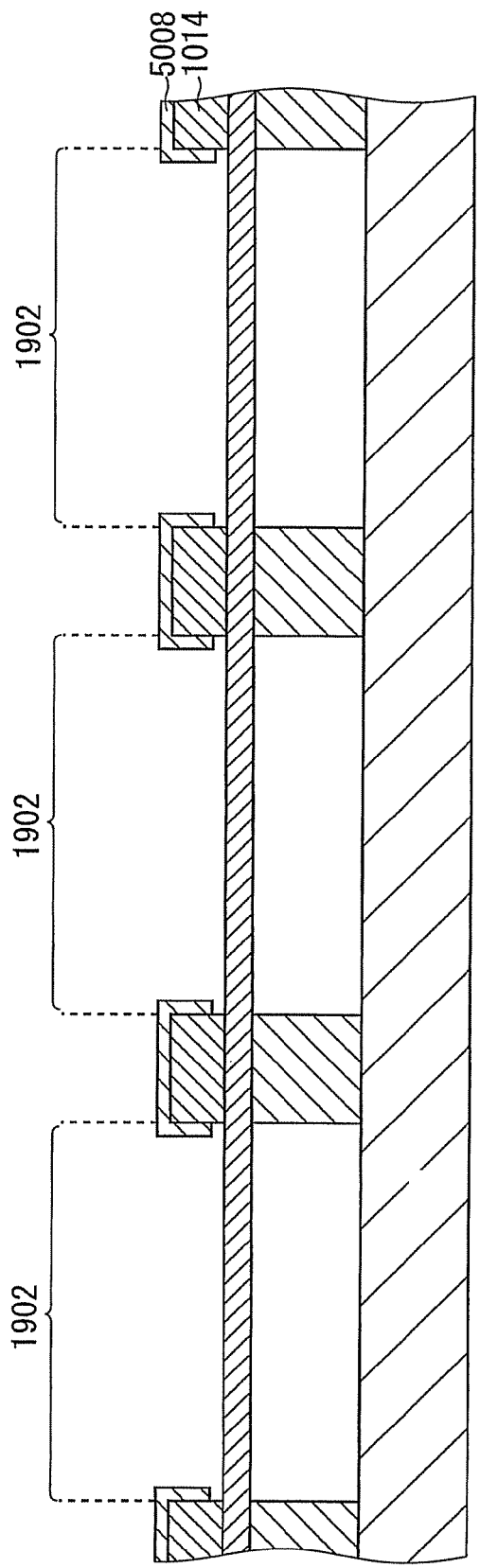
Figure 50A:
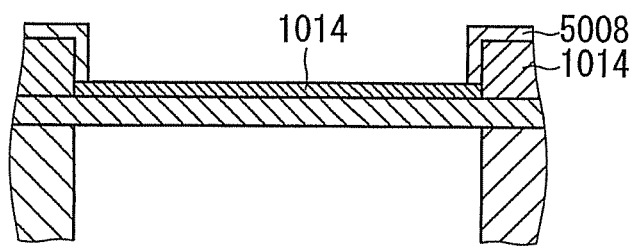
FIGS. 50A and 50B are views showing the condition of a lower electrode film having an end tail projection and the condition of the lower electrode having no end tail projection.
Figure 50B:
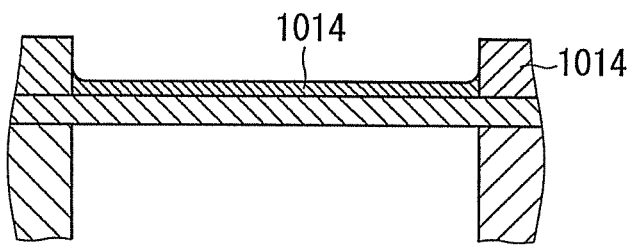

After the water-repellent film 5506 is formed, the masking film pattern 5504 and the part of the water-repellent film 5506 formed in the cavity region 1902, that is, the part formed in the region where the masking film pattern 5504 is formed are removed as shown in FIG. 49. The masking film pattern 5504 and the water-repellent film 5506 are removed, for example, by dipping the half-finished product in a solvent to dissolve the masking film pattern 5504. A water-repellent film 5008 which covers the resist film pattern 1042 is thereby formed. The end tail projection at the end of the lower electrode film 1014 as shown in FIG. 50B is limited by the water-repellent film 5008, and the lower electrode film 1014 is repelled by the water-repellent film 5008 as shown in FIG. 50A, to thereby form a flat lower electrode film 1014. The water-repellent film 5008 is removed at the same time when the resist film pattern 1042 is removed.

6 Sixth Preferred Embodiment

A sixth preferred embodiment relates to a method of forming a water-repellent pattern 6042 which may be adopted instead of the resist film pattern 1042 of the first preferred embodiment and resist film pattern 4042 of the fourth preferred embodiment.

FIGS. 51 to 56 are schematic views for describing a method of forming the water-repellent film pattern 6042 in the sixth preferred embodiment. FIGS. 51 to 56 are sectional views of the half-finished product of the piezoelectric/electrostrictive film type device 1002.

In the formation of the water-repellent film pattern 6042, as shown in FIG. 51, a resist film 6602 is formed on the surface of the substrate 1006. A resist film 6602 is formed in the same manner as the resist film 1056 of the first preferred embodiment. As the resist, a positive type photoresist is used which is increased in solubility in a developing solution when it is exposed to light. Therefore, the resist film 6602 is a photosensitive film which is increased in solubility in a developing solution when exposed to light. As the resist, it is preferable to use a thick-film responsive resist suitable to form a thick film and it is more preferable to use a high-aspect responsive resist having the characteristics that even if a pattern having a high aspect ratio is formed, the section of the pattern scarcely has a tapered form.

Figure 52:
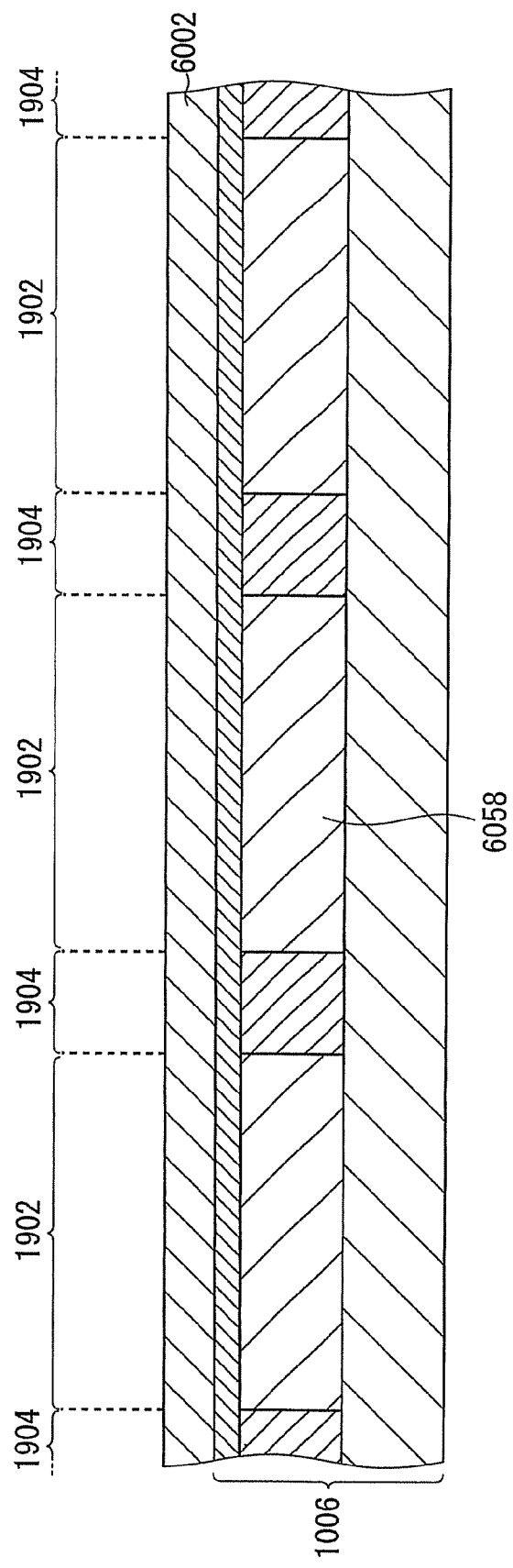

After the resist film 6602 is formed, the cavity 1024 is filled with a light-shielding agent 6058 to impart, to the substrate 1006, a function as a mask which shields the cavity region 1902 but does not shield the non-cavity region 1904 as shown in FIG. 52. The light-shielding agent 6058 is filled in the same manner as the light-shielding agent 1058 of the first preferred embodiment. In this case, the filling of the light-shielding agent 6058 in the cavity 1024 is accomplished only by carrying out this treatment before the substrate is irradiated with light from the backside which will be described later. Therefore, the resist film 6602 may be formed on the substrate 1006 after the light-shielding agent 6058 is filled in the cavity 1024. As the light-shielding agent 6058, the same one as the light-shielding agent 1058 used in the first preferred embodiment is used.

Figure 53:
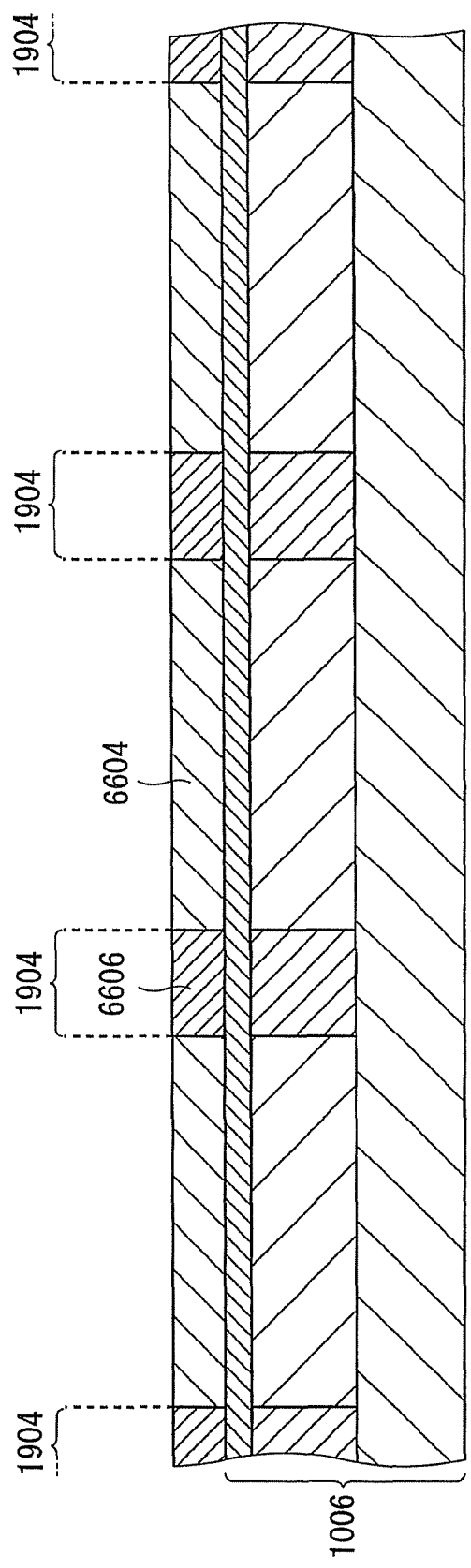

After the resist film 6602 is formed and the cavity 1024 is filled with the light-shielding agent 6058, the substrate 1006 is irradiated with light from the backside to selectively expose the resist film 6602 formed in the non-cavity region 1904, thereby forming an unexposed part 6604 and an exposed part 6606 as shown in FIG. 53. A latent image obtained by reverse transfer of the plane shape of the cavity 1024 is thus described on the resist film 6602.

Figure 54:
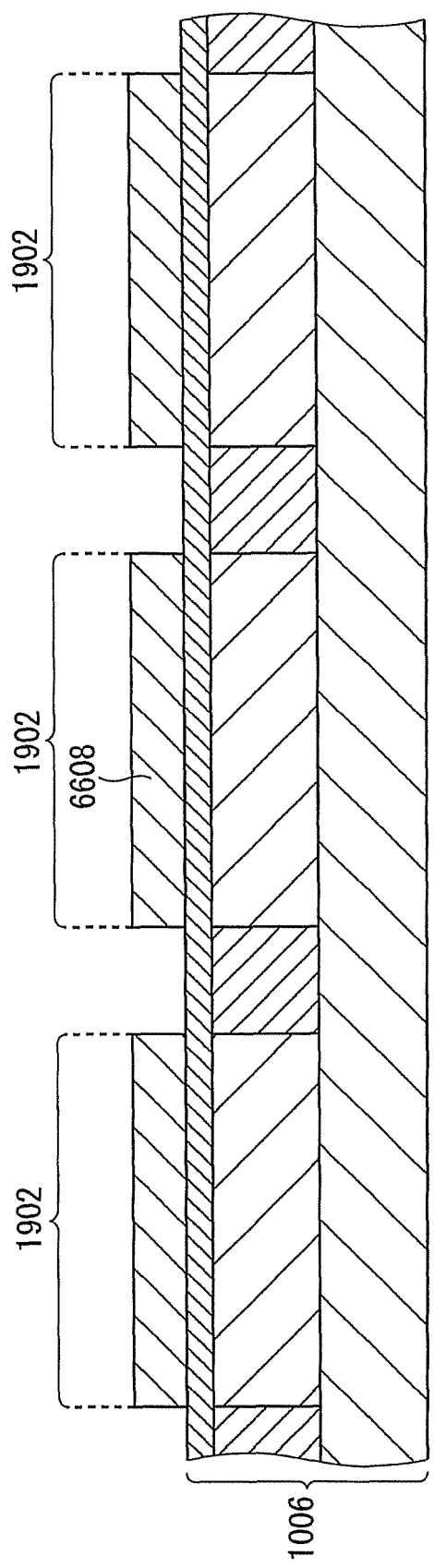

After the latent image is described, the exposed part 6606 of the resist film 6602 which is formed in the non-cavity region 1904 is removed by developing as shown in FIG. 54 to form a resist film pattern 6608 left in the cavity region 1902. The latent image is developed by dipping the half-finished product in a developing solution with fluctuation to remove the exposed part 6606, followed by washing the half-finished product with pure water or the like. In the developing of the latent image, a developing solution which selectively dissolves the exposed part 6606 and does not dissolve the non-expose part 6604 is selected.

Figure 55:
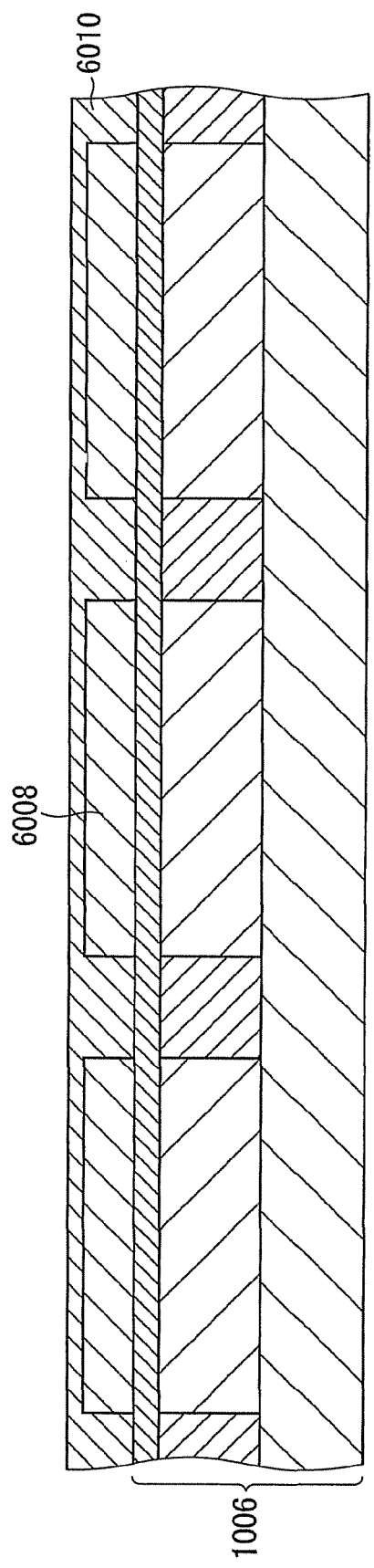

After the resist film pattern 6608 is formed, a water-repellent film 6010 is formed on the surface of the substrate 1006, such that it is overlapped on the resist film pattern 6608 as shown in FIG. 55. The water-repellent film 6010 is formed in the same manner as the water-repellent film 5506 of the fifth preferred embodiment. In the formation of the water-repellent film 6010, the same water-repellent agent that is used in the formation of the water-repellent film 5506 of the fifth preferred embodiment is used. When the water-repellent film pattern 6042 is exposed to a strong alkali reducing agent solution and plating solution in electroless plating, an appropriate water-repellent agent is selected from water-repellent agents resistant to strong alkalis.

Figure 56:
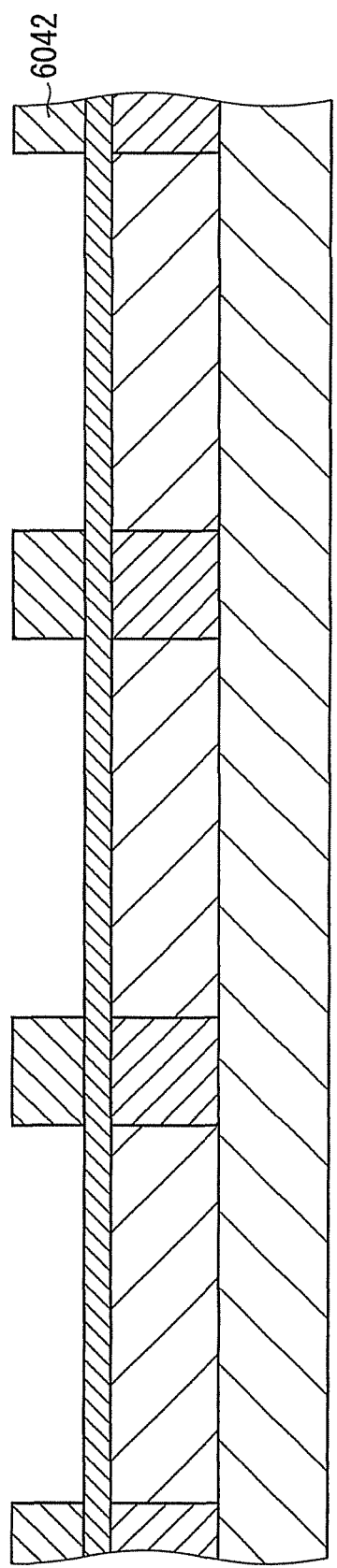
Figure 58A:
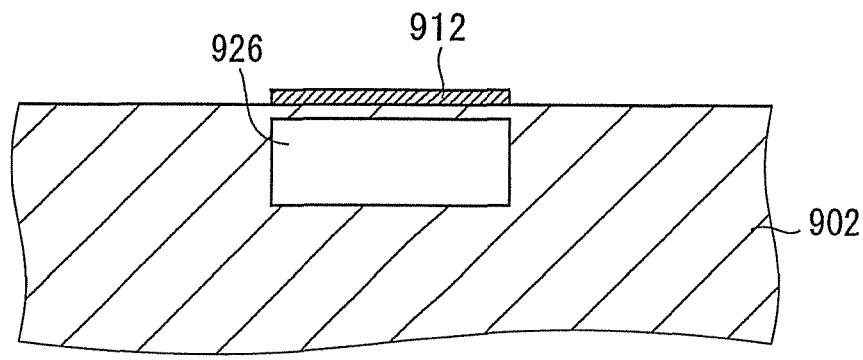
FIGS. 58A to 58C are sectional views for describing a conventional method of producing a piezoelectric/electrostrictive film type device.
Figure 58B:
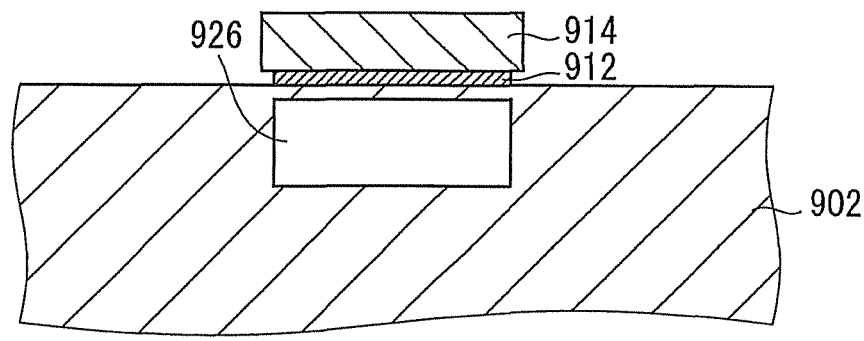
Figure 58C:
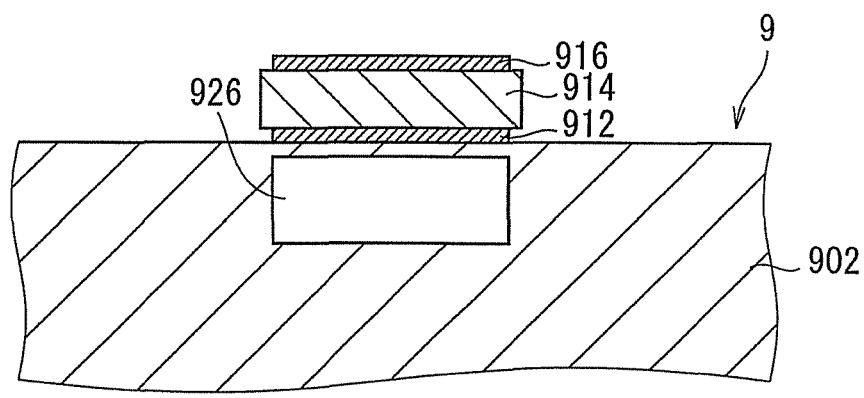

After the water-repellent film 6010 is formed, the resist film pattern 6608 and the part of the water-repellent film 6010 formed in the cavity region 1902, that is, the part formed in the region where the resist film pattern 6608 is formed are removed. The resist film pattern 6608 and the water-repellent film 6010 are removed, for example, by dipping the half-finished product in a solvent to bring the resist film pattern 6608 into contact with the solvent, to thereby dissolve the resist film pattern 6608. A water-repellent film pattern 6042 is completed as shown in FIG. 56. When this water-repellent film pattern 6042 is adopted in place of the resist film pattern 1042 or resist film pattern 4042, the lower electrode film 1014 is repelled by the water-repellent film pattern 6042 and therefore, the end tail projection at the end of the lower electrode film 1014 is limited. The contact angle of the water-repellent film pattern 6042 with the conductive material is preferably 50 degrees or more and more preferably 70 degrees or more. The water-repellent film pattern 6042 is removed in the same manner as the resist film pattern 1042.

7 Others

Although, in the above descriptions, the method of producing a piezoelectric/electrostrictive film type device is described taking the case of forming one piezoelectric/electrostrictive film as an example, the above method of producing a piezoelectric/electrostrictive film type device may also be utilized in the case of forming two or more piezoelectric/electrostrictive films. Specifically, in, also, the case of forming two or more piezoelectric/electrostrictive films, the resist film is patterned using, as a mask, an optional piezoelectric/electrostrictive constituting the vibrating laminate and an electrode film is formed on the piezoelectric/electrostrictive film by utilizing the resist film pattern as described in the first preferred embodiment. On the contrary, the resist film pattern is patterned using, as a mask, an optional electrode film constituting the vibrating laminate and a piezoelectric/electrostrictive film is formed on the electrode film by utilizing the resist film pattern as described in the second preferred embodiment.

Further, the aforementioned method of producing a piezoelectric/electrostrictive film type device is adopted not only for the production of a piezoelectric/electrostrictive film type device constituting an essential part of a piezoelectric/electrostrictive actuator but also for the production of a piezoelectric/electrostrictive film type device provided with a substrate formed with a cavity and a vibrating laminate obtained by laminating an electrode film and a piezoelectric/electrostrictive film which are aligned with the plane position of the cavity, on a first principal surface of the substrate, for example, a film bulk acoustic resonator (FBAR) having a diaphragm structure.

8 Experiments

The following descriptions will be given as to the formation of a lower electrode films 1014 and 2014 and as to the results of experiments for the evaluation of the heat resistance of these lower electrodes 1014 and 2014.

The substrate 1006 used in the following experiments was a sintered body obtained by laminating green sheets of partially stabilized zirconium oxide and by sintering the laminate at 1450° C. The plate thicknesses of the base plate 1008, base plate 1010 and vibrating plate 1012 were designed to be 150 µm, 80 µm and 5 µm respectively. The width W1 and length L of the cavity 1024 were designed to be 200 µm and 1 mm respectively.

8.1 Experiment 1

In Experiment 1, a lower electrode film 1014 was formed on the surface of the substrate 1006 according to the procedures described in the first preferred embodiment.

In the process of forming the resist film 1056, a resist solution was applied to the surface of the substrate 1006 by a spin coater and the half-finished product was heated by a hot plate to vaporize a solvent from the coating film. When the resist solution was applied, the number of rotations of the spin coater was set to 1000 rpm and the rotation holding time was set to 6 sec. When the solvent was vaporized, the temperature was set to 100° C. and the heating time was set to 3 min. As the resist solution, a polyimide coating agent having a solid content of 19% by weight was used. The film thickness of the formed resist film pattern 1042 was 6.5 µm.

In the process of filling the light-shielding agent 1058, a light-shielding solution was injected into the cavity 1024 from the ink jetting hole 1020 and ink supply hole 1022, the half-finished product was received in a vacuum chamber to carry out defoaming treatment of the light-shielding solution and the half-finished product was heated by a hot plate to vaporize a solvent from the light-shielding solution. When the defoaming operation of the light-shielding solution was carried out, the pressure was set to 6.7 Pa. When the solvent was vaporized, the temperature was set to 90° C. and the heating time was set to 20 min. The light-shielding solution contains pigments wherein the solid concentration of the pigments was 19%. The optical density of the light-shielding agent 1058 was 2.3 on OD (Optical Density) basis. The film thickness of the filled light-shielding agent 1058 was 1.2 µm.

In the process of exposing the resist film 1056 to light, the resist film 1056 were irradiated with three beams having wavelengths of 365 nm, 405 nm and 436 nm for one minute in such a manner that the integrating quantity of light was 60 mJ/cm$^2$. As the exposing apparatus, Multi-light (manufactured by Ushio Inc. in Chiyoda-ku, Tokyo) was used.

In the process of developing a latent image, the half-finished product was dipped in a developing solution with fluctuation, and was then washed with pure water, followed by drying the half-finished product. The time during which the half-finished product is dipped in the developing solution was set to 1 to 2 min. As the developing solution, an aqueous solution of TMAH (tetramethylammonium hydroxide) was used. The concentration of TMAH was set to 2.38% by weight. The temperature at which the half-finished product was dried was set to 129° C. The half-finished product was dried for 5 min.

In the process of curing the exposed part 1062 to a solid, the half-finished product was received in a natural convection type oven. The temperature at which the exposed part 1062 was cured to a solid was set to 230° C. and the heating time at this time was set to 60 min.

In the process of forming the resinate film 1044, a catalyst metal resinate solution was applied to the surface of the substrate 1006 by a spin coater and the half-finished product was heated by a hot plate to vaporize a solvent from the coating film. The temperature and heating time when the solvent was vaporized were set to 100° C. and 15 min. respectively. As the catalyst metal resinate solution, a platinum resinate solution having a platinum content of 17% by weight was used. The formed resinate film 1044 had a film thickness of 3 to 10 µm.

In the process of firing the resinate film 1044, the resinate film was fired according to a firing profile in which the maximum temperature of 800° C. was kept for 7 min.

In the process of reducing the catalyst layer pattern 1046, the half-finished product was washed with pure water after it was dipped in a reducing agent solution. As the reducing agent solution, an aqueous combined solution of sodium hydroxide and sodium borohydride was used. The ratio by weight of sodium hydroxide to sodium borohydride was set to 3:1 and the concentration of sodium hydroxide and sodium borohydride was set to 1.5% by weight. The temperature of the reducing agent solution was set to 30° C. The time during which the half-finished product was dipped in the reducing agent solution was set to 15 min.

In the process of precipitating a conductive material, the half-finished product was dried by a drier after the half-finished product was dipped in a 50° C. plating solution for 1.5 to 5.0 Hr. As the plating solution, an exclusive electroless plating solution (aqueous platinum compound solution containing a platinum compound in a concentration of 1% by weight) was used. The concentration of platinum was adjusted to 0.24 to 0.30 g/l corresponding to the target film thickness (0.2 to 0.8 µm) of the lower electrode film 1014.

In the process of removing the resist film pattern 1042, the half-finished product was heat-treated in a belt system continuous firing furnace in the condition that the surface of the substrate 1006 was made to face downward and then, air is blown to the surface of the substrate 1006 to remove a residue. In the heat treatment, a heat treating profile was used in which the temperature was raised to 600° C. over 27 min, kept at 600° C. for 7 min, and then dropped to normal temperature over 26 min.

8.2 Experiment 2

In Experiment 2, the lower electrode film 2014 was formed on the surface of the substrate 1006 according to the procedures described in the second preferred embodiment.

In the process of roughing the surface of the substrate 1006, the half-finished product was dipped in an etching solution, washed with water and dried by a drier. The time during which the half-finished product was dipped in the etching solution was set to 15 min. As the etching solution, hydrofluoric acid was used. The concentration of hydrogen fluoride was set to 30% by weight. The solution temperature of the etching solution was set to 40 to 50° C. In the washing, a ultrasonic cleaner was used. The time required for washing was set to 5 min. The temperature of water was set to ambient temperature.

In the process of forming the catalyst layer 2046, the half-finished product was dipped in the catalyst metal solution and then, dried. As the catalyst metal solution, an aqueous chloroplatinic acid solution was used. The concentration of chloroplatinic acid was set to 0.01% by weight. The time during which the half-finished product was dipped was set to 5 min. The temperature of the catalyst metal solution was set to 30° C. In the drying, the half-finished product was naturally dried at ambient temperature and then received in a natural convection type oven to carry out a drying operation under heating. The time for the natural drying was set to 20 min. When the drying operation was carried out under heating, the temperature was set 125° C. and the heating time was set to 20 min.

In the remaining processes, the same conditions as in Experiment 1 were adopted.

8.3 Experiment 3

In Experiment 3, the lower electrode film 2014 was formed on the surface of the substrate 1006 according to the procedures described in the second preferred embodiment.

In the process of forming the catalyst layer 2046, the half-finished product was dried after it was dipped in the catalyst metal dispersion solution. As the catalyst metal dispersion solution, a platinum nano-colloid dispersion solution was used. The particle size of the platinum microparticles was 5 nm. In the drying, the half-finished product was naturally dried at ambient temperature and then received in a natural convection type oven to carry out a drying operation under heating. The time for the natural drying was set to 20 min. When the drying operation was carried out under heating, the temperature was set 125° C. and the heating time was set to 20 min.

In the remaining processes, the same conditions as in Experiment 2 were adopted.

8.4 Experiment 4

In Experiment 4, the lower electrode film 2014 was formed on the surface of the substrate 1006 according to the procedures described in the second preferred embodiment.

In the process of forming the catalyst layer 2046, a catalyst metal was vapor-deposited on the surface of the substrate 1006 by sputter vapor deposition. As the catalyst metal, platinum was used. The film thickness of the catalyst layer 2046 was 0.1 µm.

In the remaining processes, the same conditions as in Experiment 2 were adopted.

8.5 Experiment 5

In Experiment 5, the heat resistances of the lower electrodes 1014 and 2014 formed in Experiments 1 to 4 were evaluated.

In the evaluation of the heat resistance, the substrate 1006 formed with the lower electrode 1014 or 2014 was heat-treated and electron microscope (SEM) images of the lower electrode films 1014 and 2014 after the heat treatment were subjected to image processing to thereby calculate the coating ratios of the lower electrode films 1014 and 2014.

As a result, the coating ratios of the lower electrodes 1014 and 2014 formed in Experiments 1 to 4 were all satisfactory. As a typical example, the coating ratio of the lower electrode film 1014 formed in Experiment 2 was compared with that of a lower electrode film produced through a process of applying a conductive material paste by screen printing. The results are shown in FIG. 57. FIG. 57 is a graph showing a variation in the coating ratio of the lower electrode film 1014 or 2014 after the heat treatment as a function of the film thickness of the lower electrode film 1014 or 2014.

When the lower electrode films 1014 and 2014 were formed by electroless plating, a sufficient coating ratio is obtained even if the thickness of the coating film was lower than that of the coating film formed in the case of applying a conductive material paste by screen printing as shown in FIG. 57.

It is not beyond our estimations to use combinations of matters described in the first to sixth preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A method of producing a piezoelectric/electrostrictive film type device comprising:
    a substrate formed with a cavity; and
    a vibrating laminate obtained by laminating electrode films and a piezoelectric/electrostrictive film which are aligned with a plane position of said cavity, on a first principal surface of said substrate, the method comprising the steps of:
    (a) producing said substrate;
    (b) forming a first photoresist film on the first principal surface of said substrate;
    (c) irradiating said substrate with light from a second principal surface side to describe a latent image obtained by transferring a plane shape of said cavity to said first photoresist film by causing light with which said substrate is irradiated from the second principal surface to expose said first photoresist, said first principal surface being opposite to said second principal surface;
    (d) removing said first photoresist film formed in a region where said cavity is formed or a region where said cavity is not formed, by developing to form a first photoresist film pattern;
    (e) forming a lowermost electrode film constituting said vibrating laminate employing said first photoresist film, said lowermost electrode film comprising a plating film; and
    (f) forming films other than said lowermost electrode film among the electrode films and the piezoelectric/electrostrictive film constituting said vibrating laminate.

2. The method of producing a piezoelectric/electrostrictive film type device according to claim 1, wherein
    in said step (d), said first photoresist film formed in the region where said cavity is formed is removed, and
    said step (e) includes the steps of:
    (e-1) forming a resinate film containing a resinate of a catalyst metal on the first principal surface of said substrate such that the resinate film is overlapped on said first photoresist film pattern;
    (e-2) removing said first photoresist film pattern and said resinate film formed in the region where said first photoresist film pattern is formed to form a resinate film pattern;
    (e-3) firing said resinate film pattern to form a catalyst layer pattern in which catalyst metal cores exist in a dispersed state; and
    (e-4) forming said plating film on said catalyst layer pattern by electroless plating to form said lowermost electrode film.

3. The method of producing a piezoelectric/electrostrictive film type device according to claim 2, wherein
    in said step (a), said substrate on which said first principal surface is spaced away from said cavity by a plate having a plate thickness of 30 μm or less is produced.

4. The method of producing a piezoelectric/electrostrictive film type device according to claim 2, the method further comprising the step of:
    (g) filling a light-shielding agent in said cavity before said step (c), wherein
    in said step (c), said first photoresist film formed in the region where said cavity is not formed is selectively exposed; and
    in said step (d), an unexposed part of said first photoresist film is removed.

5. The method of producing a piezoelectric/electrostrictive film type device according to claim 4, wherein
    in said step (g), said light-shielding agent containing a pigment is filled.

6. The method of producing a piezoelectric/electrostrictive film type device according to claim 2, wherein
    in said step (c), said first photoresist film formed in the region where said cavity is formed is selectively exposed; and
    in said step (d), the exposed part of said first photoresist film is removed.

7. The method of producing a piezoelectric/electrostrictive film type device according to claim 6, the method further comprising the step of:
    (h) forming a light-shielding film in the region where said cavity is not formed on the second principal surface of said substrate before said step (c).

8. The method of producing a piezoelectric/electrostrictive film type device according to claim 7, wherein;
    in said step (h), said light-shielding film containing a pigment is formed.

9. The method of producing a piezoelectric/electrostrictive film type device according to claim 2, wherein
    said step (f) includes the steps of:
    (f-1) forming a second photoresist film on the first principal surface of said substrate such that the second photoresist film is overlapped on the piezoelectric/electrostrictive film constituting said vibrating laminate;
    (f-2) irradiating said substrate with light from the second principal surface side to selectively expose said second photoresist film formed in the region where said piezoelectric/electrostrictive film is not formed;
    (f-3) removing the unexposed part of said second photoresist film to form a second photoresist film pattern;
    (f-4) forming an electrode film constituting said vibrating laminate in the region where said second photoresist film pattern is not formed; and
    (f-5) removing said second photoresist film pattern.

10. The method of producing a piezoelectric/electrostrictive film type device according to claim 2, wherein
    said step (f) includes the steps of:
    (f-6) forming a third photoresist film on the first principal surface of said substrate such that the third photoresist film is overlapped on at least one of said electrode film constituting said vibrating laminate;
    (f-7) irradiating said substrate with light from the second principal surface side to selectively expose said third photoresist film formed in the region where said electrode film is not formed;
    (f-8) removing the unexposed part of said third photoresist film to form a third photoresist film pattern;
    (f-9) forming the piezoelectric/electrostrictive film constituting said vibrating laminate in the region where said third photoresist film pattern is not formed; and
    (f-10) removing said third photoresist film pattern.

11. The method of producing a piezoelectric/electrostrictive film type device according to claim 2, wherein
said step (f) includes the step of:
(f-11) making a piezoelectric/electrostrictive material flow towards at least one said electrode film constituting said vibrating laminate by electrophoresis to form the piezoelectric/electrostrictive film constituting said vibrating laminate.

12. The method of producing a piezoelectric/electrostrictive film type device according to claim 2, the method further comprising the step of:
(i) coating said first photoresist film pattern with a water-repellent film having higher water-repellency than said first photoresist film pattern after said step (d) and before said step (e).

13. The method of producing a piezoelectric/electrostrictive film type device according to claim 12, wherein
said step (i) includes the steps of:
(i-1) forming a masking film on the first principal surface such that the masking film is overlapped on said first photoresist film pattern;
(i-2) removing said masking film until said first photoresist film pattern is exposed to form a masking film pattern;
(i-3) forming the water-repellent film on the first principal surface of said substrate such that the water-repellent film is overlapped on said first photoresist film pattern and said masking film pattern; and
(i-4) removing said masking film pattern and said water-repellent film formed on said masking film pattern.

14. The method of producing a piezoelectric/electrostrictive film type device according to claim 1, wherein
in said step (d), said first photoresist film formed in the region where said cavity is formed is removed, and
said step (e) includes the steps of:
(e-1) forming a catalyst layer in which catalyst metal cores exist in a dispersed state on the first principal surface of said substrate such that the catalyst layer is overlapped on said first photoresist film pattern;
(e-2) forming said plating film on said catalyst layer by electroless plating; and
(e-3) removing said first photoresist film pattern, and said catalyst layer and plating film formed in the region where said first photoresist film pattern is formed, to form said lowermost electrode film.

15. The method of producing a piezoelectric/electrostrictive film type device according to claim 14, the method further comprising the step of:
(g) coating said first photoresist film pattern with a water-repellent film having higher water-repellency than said first photoresist film pattern after said step (d) and before said step (e).

16. The method of producing a piezoelectric/electrostrictive film type device according to claim 15, wherein
said step (g) includes the steps of:
(g-1) forming a masking film on the first principal surface of said substrate such that the masking film is overlapped on said first photoresist film pattern;
(g-2) removing said masking film until said first photoresist film pattern is exposed to form a masking film pattern;
(g-3) forming the water-repellent film on the first principal surface of said substrate such that the water-repellent film is overlapped on said first photoresist film pattern and said masking film pattern; and
(g-4) removing said masking film pattern and said water-repellent film formed on said masking film pattern.

17. The method of producing a piezoelectric/electrostrictive film type device according to claim 14, the method further comprising the step of:
(h) surface-roughing the first principal surface of said substrate after said step (a) and before said step (b).

18. The method of producing a piezoelectric/electrostrictive film type device according to claim 17, the method further comprising the step of:
(i) forming an adhesive layer which improves the adhesion of said plating film on the first principal surface of said substrate after said step (a) and before said step (b).

19. The method of producing a piezoelectric/electrostrictive film type device according to claim 14, wherein
in said step (e-1), a catalyst metal solution prepared by dissolving a catalyst metal in a solvent is brought into contact with the first principal surface of said substrate.

20. The method of producing a piezoelectric/electrostrictive film type device according to claim 14, wherein
in said step (e-1), a catalyst metal dispersion solution prepared by dispersing catalyst metal microparticles in a dispersing medium is brought into contact with the first principal surface of said substrate.

21. The method of producing a piezoelectric/electrostrictive film type device according to claim 14, wherein
in said step (e-1), a catalyst metal is formed on the first principal surface of said substrate by vapor deposition.

22. The method of producing a piezoelectric/electrostrictive film type device according to claim 1, wherein
in said step (d), said first photoresist film formed in the region where said cavity is not formed is removed, and
said step (e) includes the steps of:
(e-1) forming a water-repellent film on the first principal surface of said substrate such that the water-repellent film is overlapped on said first photoresist film pattern;
(e-2) removing said first photoresist film pattern and said water-repellent film pattern formed in the region where said first photoresist pattern is formed, to form a water-repellent film pattern;
(e-3) forming a resinate film containing a catalyst metal resinate on the first principal surface of said substrate such that the resinate film is overlapped on said water-repellent film pattern;
(e-4) removing said water-repellent film pattern to form a resinate film pattern;
(e-5) firing said resinate film pattern to form a catalyst layer pattern in which catalyst metal cores exist in a dispersed state; and
(e-6) forming said plating film on said catalyst layer pattern by electroless plating to form said lowermost electrode film.

23. The method of producing a piezoelectric/electrostrictive film type device according to claim 1, wherein
in said step (d), said first photoresist film formed in the region where said cavity is not formed is removed, and
said step (e) includes the steps of:
(e-1) forming a water-repellent film on the first principal surface of said substrate such that the water-repellent film is overlapped on said first photoresist film pattern;
(e-2) removing said first photoresist film pattern and said water-repellent film pattern formed in the region where said first photoresist pattern is formed, to form a water-repellent film pattern;
(e-3) forming a catalyst layer in which catalyst metal cores exist in a dispersed state on the first principal surface of said substrate such that the catalyst layer is overlapped on said water-repellent film pattern;

(e-4) forming the plating film on said catalyst layer by electroless plating;
(e-5) removing said water-repellent film pattern and said catalyst layer and the plating film formed in the region where said water repellent film pattern is formed to form said lowermost electrode film.

* * * * *